(12) United States Patent
Barnes et al.

(10) Patent No.: US 9,396,814 B2
(45) Date of Patent: Jul. 19, 2016

(54) SYSTEMS AND METHODS FOR ACOUSTIC WAVE ENABLED DATA STORAGE

(71) Applicant: Elwha LLC, Bellevue, WA (US)

(72) Inventors: Philip Lionel Barnes, Seattle, WA (US); Hon Wah Chin, Palo Alto, CA (US); Howard Lee Davidson, San Carlos, CA (US); Kimberly D. A. Hallman, Bellevue, WA (US); Roderick A. Hyde, Redmond, WA (US); Muriel Y. Ishikawa, Livermore, CA (US); Jordin T. Kare, Seattle, WA (US); Brian Lee, Redmond, WA (US); Richard T. Lord, Gig Harbor, WA (US); Robert W. Lord, Seattle, WA (US); Craig J. Mundie, Seattle, WA (US); Nathan P. Myhrvold, Bellevue, WA (US); Nicholas F. Pasch, Bellevue, WA (US); Eric D. Rudder, Mercer Island, WA (US); Clarence T. Tegreene, Mercer Island, WA (US); Marc Tremblay, Clyde Hill, WA (US); David B. Tuckerman, Lafayette, CA (US); Charles Whitmer, North Bend, WA (US); Lowell L. Wood, Jr., Bellevue, WA (US)

(73) Assignee: ELWHA LLC, Bellevue, WA (US)

( * ) Notice: Subject to any disclaimer, the term of this patent is extended or adjusted under 35 U.S.C. 154(b) by 132 days.

(21) Appl. No.: 14/296,080

(22) Filed: Jun. 4, 2014

(65) Prior Publication Data

US 2015/0357044 A1    Dec. 10, 2015

(51) Int. Cl.
G11C 5/02 (2006.01)
G11C 19/28 (2006.01)
G11C 11/56 (2006.01)

(52) U.S. Cl.
CPC .............. *G11C 19/282* (2013.01); *G11C 11/56* (2013.01); *G11C 19/28* (2013.01); *G11C 19/287* (2013.01)

(58) Field of Classification Search
CPC ............................. G11C 19/28; G11C 19/282
See application file for complete search history.

(56) References Cited

U.S. PATENT DOCUMENTS

| 3,858,232 A | 12/1974 | Boyle et al. |
| 3,886,529 A | 5/1975 | Bert et al. |
| 4,290,118 A | 9/1981 | Stern et al. |
| 4,366,285 A | 12/1982 | Lukaschek et al. |

(Continued)

OTHER PUBLICATIONS

PCT International Search Report; International App. No. PCT/US2015/033936; Nov. 5, 2015; pp. 1-4.

(Continued)

*Primary Examiner* — Hai L Nguyen

(57) ABSTRACT

The present disclosure provides systems and methods for storing, reading, and writing data using particle-based acoustic wave driven shift registers. The shift registers may physically shift particles along rows and/or columns of wells through the interactions of two parallel surfaces. A transducer may generate an acoustic wave to displace one or more of the two parallel surfaces. The particles may be transferred to and/or otherwise constrained by a buffer surface during at least a portion of the acoustic wave, such that the particles may be shifted during one or more cycles of the acoustic wave. In various embodiments, the amplitude of the acoustic wave may correspond to the spacing distance between each of the wells. The wells may be physical and/or potential wells.

41 Claims, 27 Drawing Sheets

(56) References Cited

U.S. PATENT DOCUMENTS

| | | | |
|---|---|---|---|
| 5,243,556 A | 9/1993 | Grudkowski | |
| 9,041,453 B2 * | 5/2015 | Miyake | G09G 3/3677 327/242 |
| 2005/0248980 A1 | 11/2005 | Han et al. | |

OTHER PUBLICATIONS

Papanicolaou, N. et al., The Study of Surface Acoustic Wave Charge Transfer Device, NASA-CR-157241 (Jul. 13, 1978), http://ntrs.nasa.gov/archive/nasa/casi.ntrs.nasa.gov/19780019011.

* cited by examiner

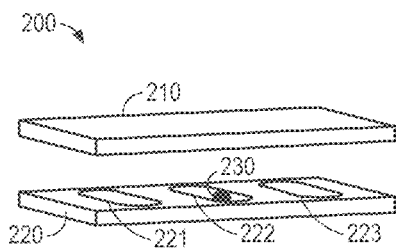
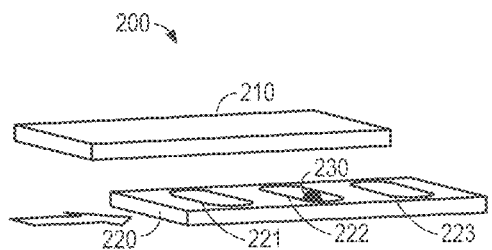
FIG. 2A  FIG. 2B
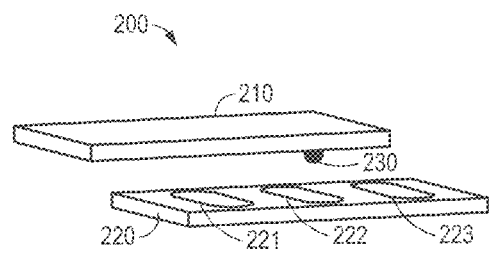
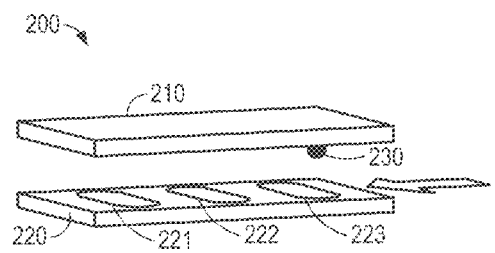
FIG. 2C  FIG. 2D
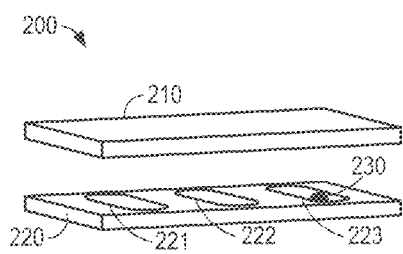
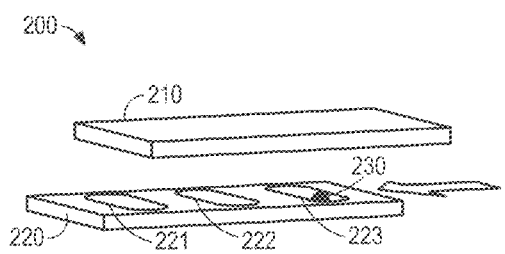
FIG. 2E  FIG. 2F
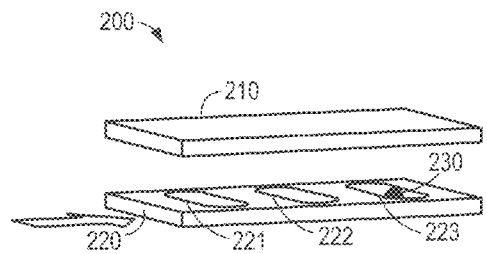
FIG. 2G

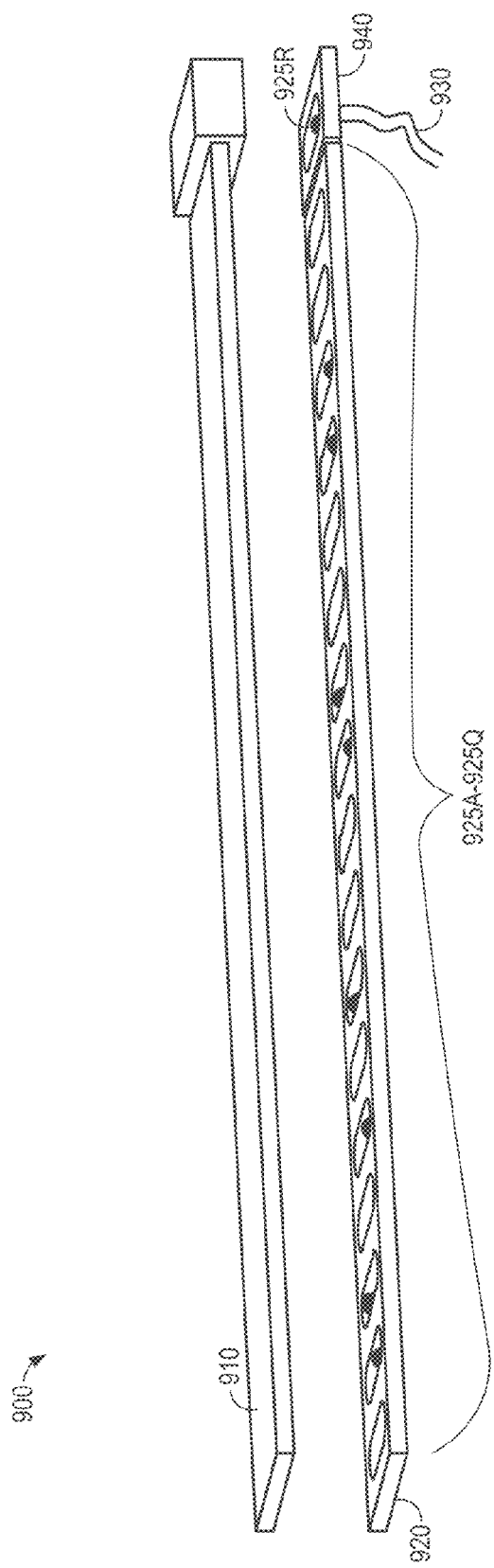

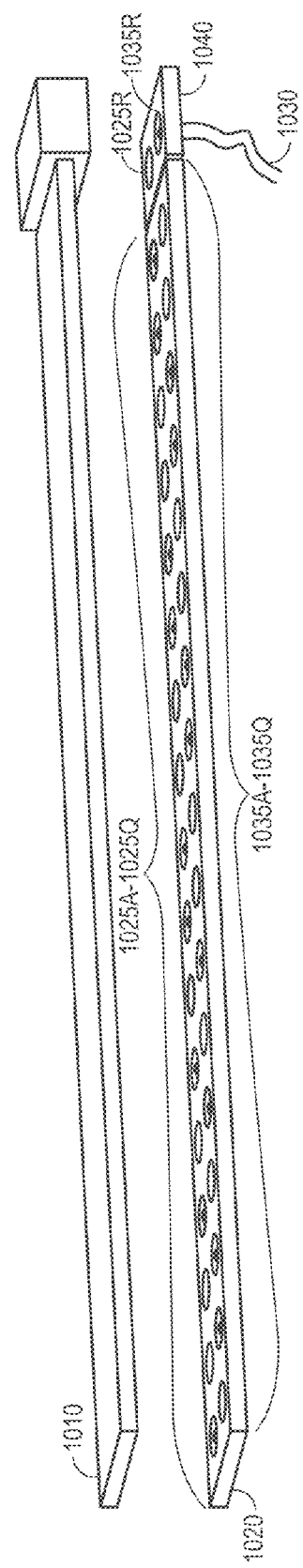

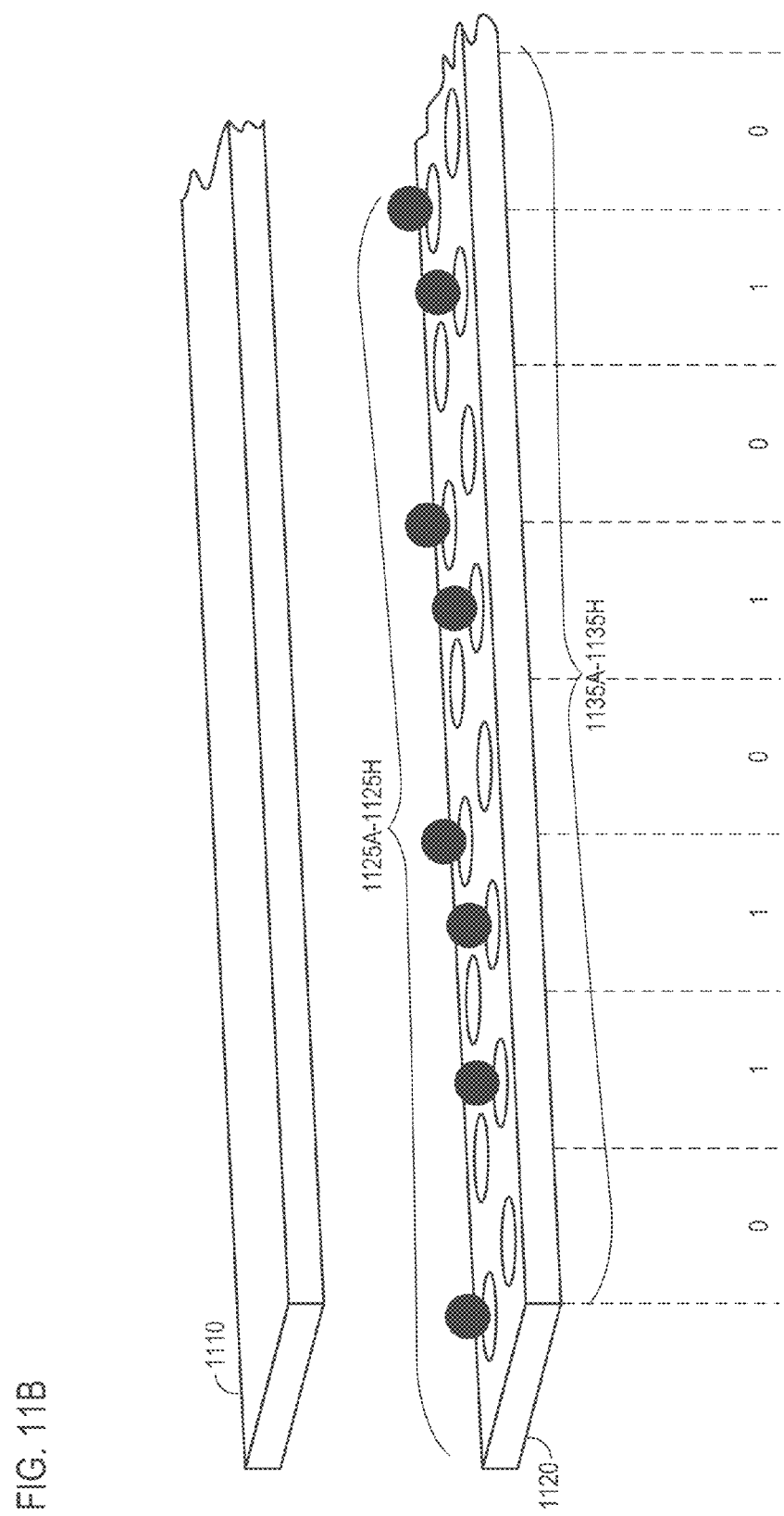

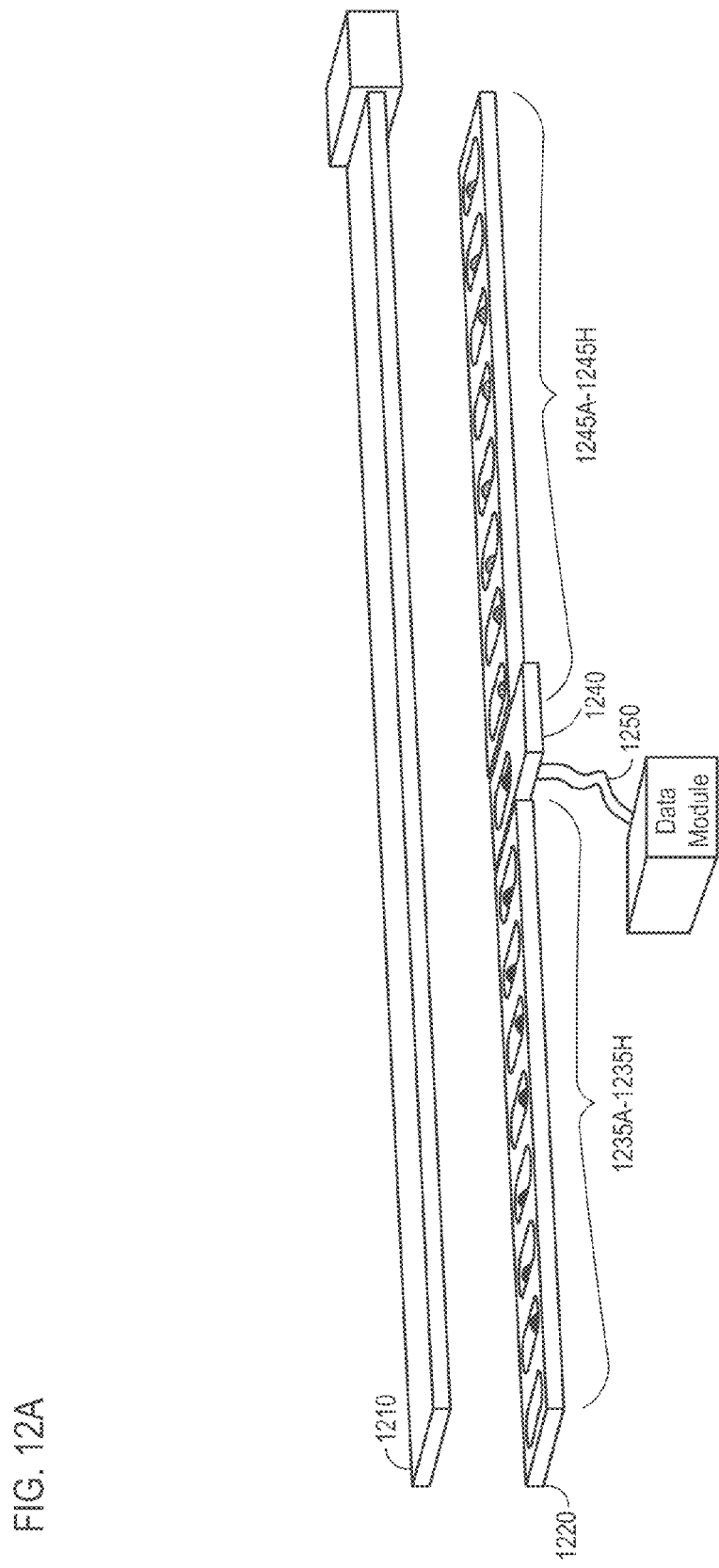

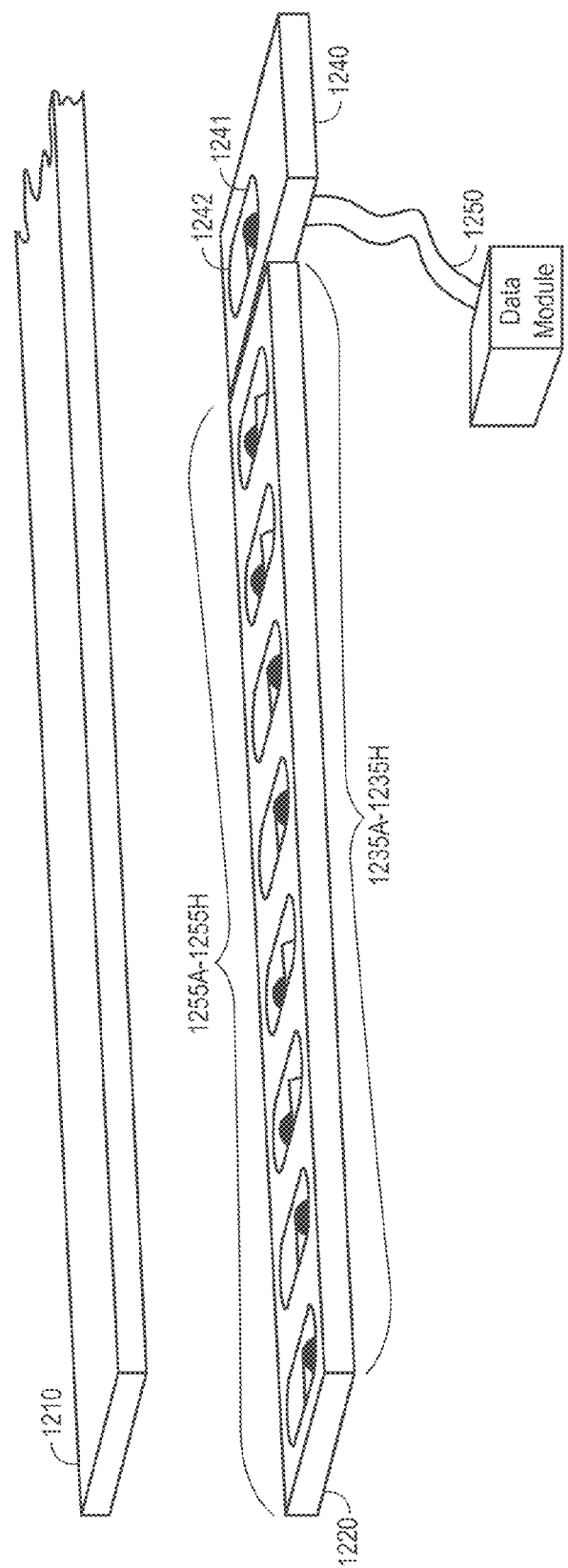

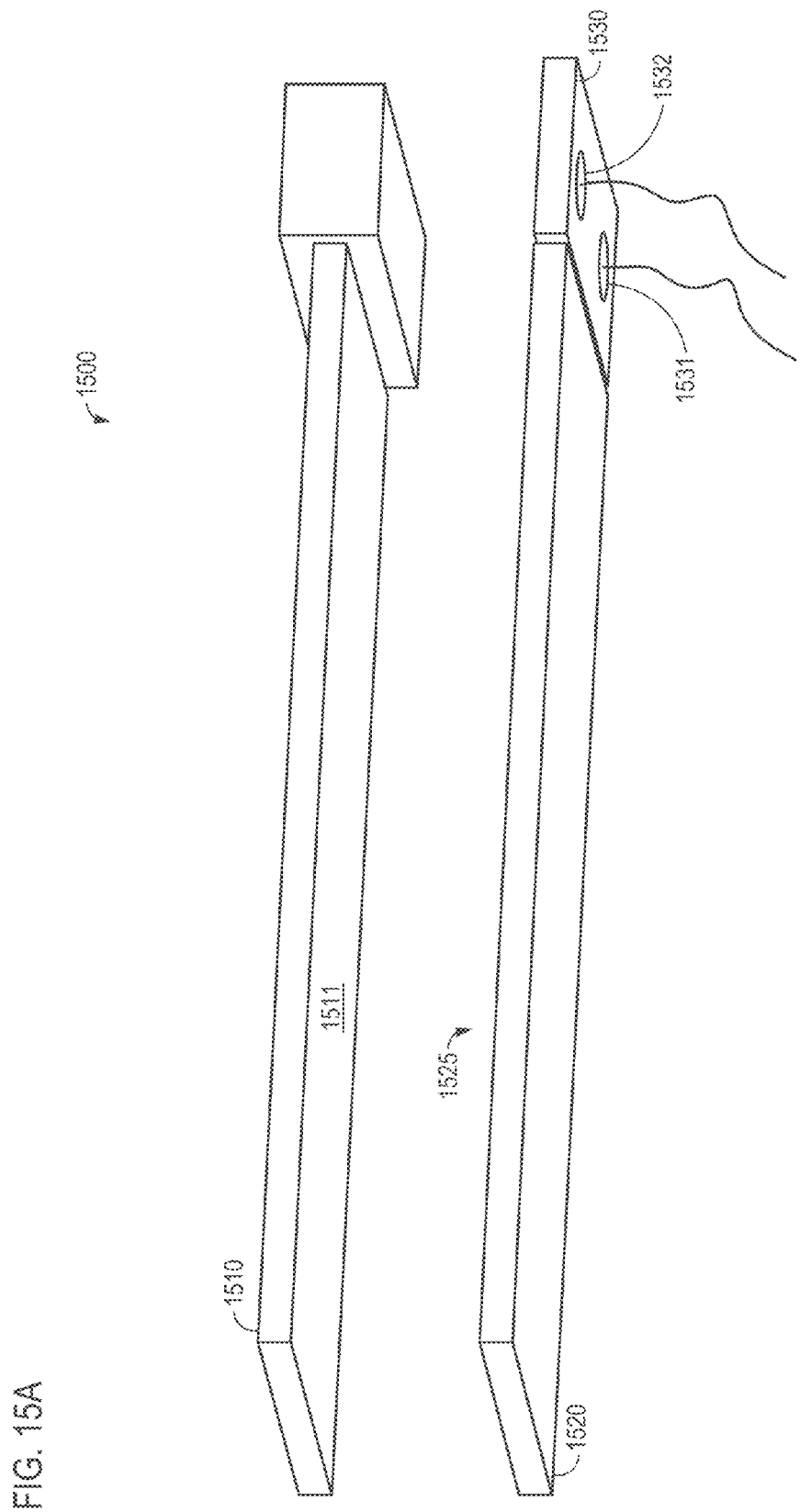

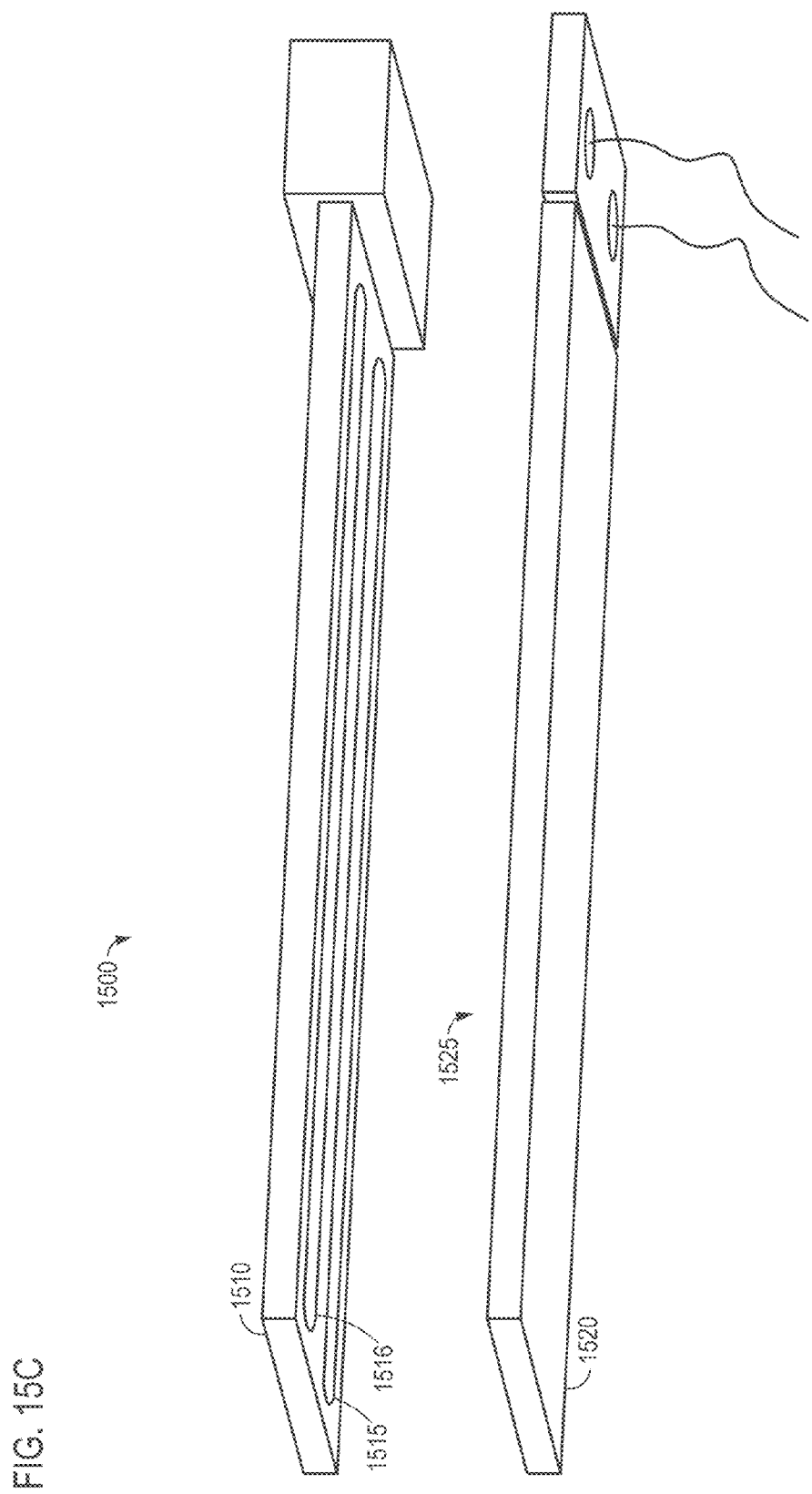

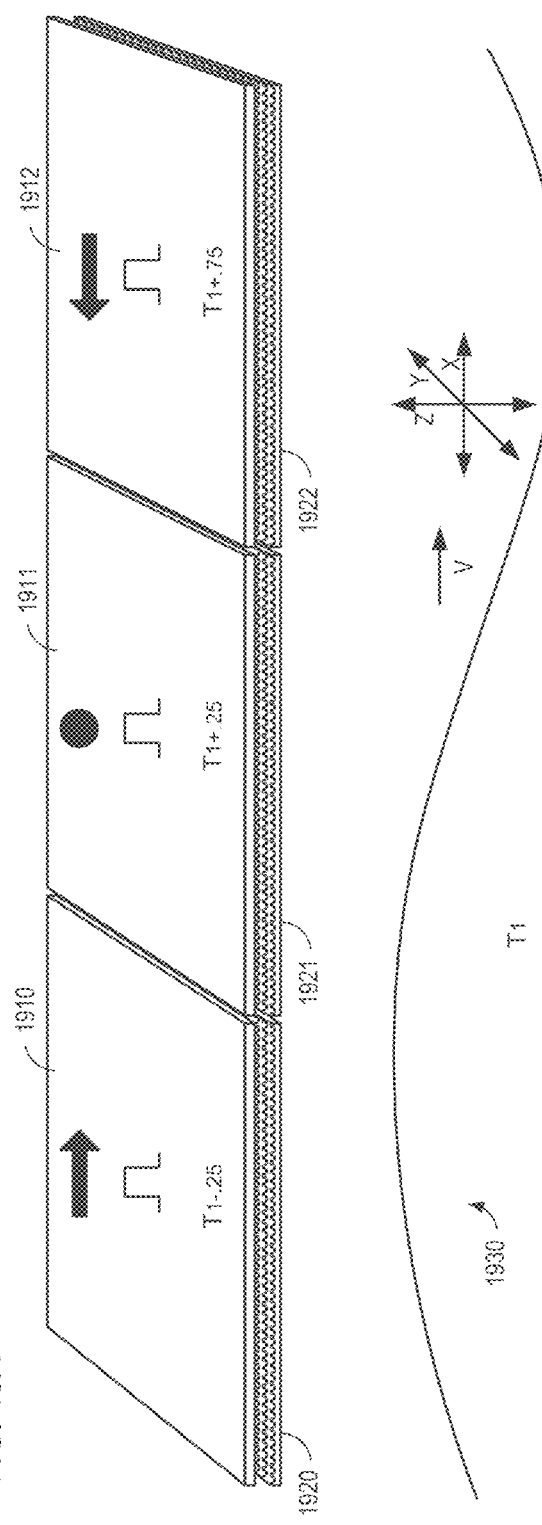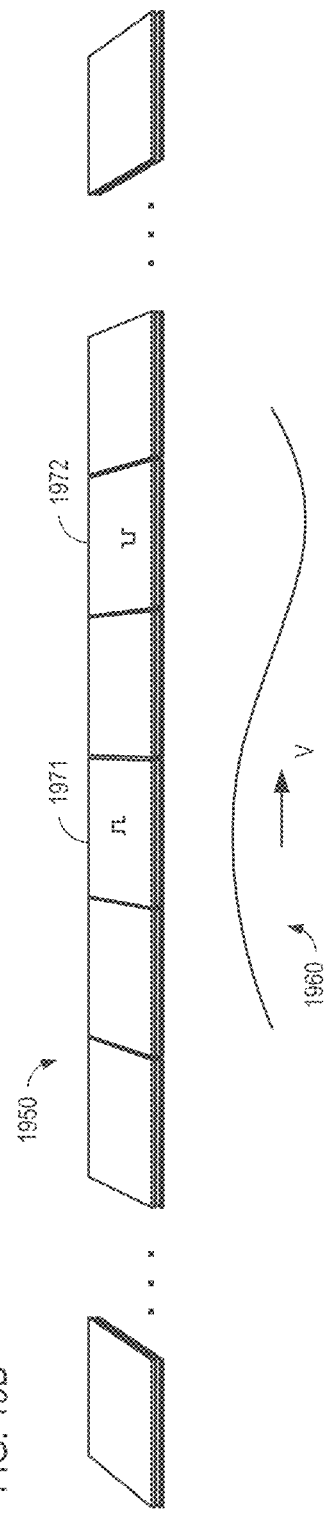
FIG. 19A
FIG. 19B

SYSTEMS AND METHODS FOR ACOUSTIC WAVE ENABLED DATA STORAGE

If an Application Data Sheet (ADS) has been filed on the filing date of this application, it is incorporated by reference herein. Any applications claimed on the ADS for priority under 35 U.S.C. §§119, 120, 121, and/or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority applications"), if any, listed below (e.g., claims earliest available priority dates for other than provisional patent applications or claims benefits under 35 U.S.C. §119(e) for provisional patent applications, for any and all parent, grandparent, great-grandparent, etc. applications of the Priority Application(s)). In addition, the present application is related to the "Related Applications," if any, listed below.

PRIORITY APPLICATIONS

None

If the listings of applications provided above are inconsistent with the listings provided via an ADS, it is the intent of the Applicant to claim priority to each application that appears in the Priority Applications section of the ADS and to each application that appears in the Priority Applications section of this application.

All subject matter of the Priority Applications and the Related Applications and of any and all parent, grandparent, great-grandparent, etc. applications of the Priority Applications and the Related Applications, including any priority claims, is incorporated herein by reference to the extent such subject matter is not inconsistent herewith.

TECHNICAL FIELD

This disclosure relates to data storage devices and shift registers. Specifically, this application relates to physical data storage devices in which physical media represent bits and acoustic waves are used to shift the physical media.

SUMMARY

The present disclosure provides various systems and methods associated with data storage devices and shift registers in which physical media represents bits and acoustic waves are used to shift the physical media. For example, in one embodiment, a plurality of particles are disposed within a matrix of wells on a first surface. Each of the wells may be spaced by a predetermined spacing distance. The matrix may be any size, width, or length. For instance, the matrix of wells may be a 1×N matrix, where N is a whole number. The matrix may also be an M×N matrix, where M and N are whole numbers. The M×N matrix may be repeated any number of times along the longitudinal axis of the surface as a plurality of sets of well, where each set of wells comprises an M×N matrix of wells.

Physical particles may be selectively deposited in the wells to represent states in a multi-state data representation system. For example, the presence of a particle in a well may represent a 1 and the lack of a particle may represent a 0 in a binary data representation system. Alternative data representation schemes may be utilized as described and claimed herein.

A buffer surface may be disposed parallel to the plane of the first surface. In various embodiments, at least some of the plurality of particles may be transferred from the first surface to the buffer surface when one or both of the first surface and the buffer surface are displaced relative to one another by the acoustic wave. The plurality of particles may be transferred between the buffer surface and the first surface at various displacement positions during a cycle of displacement.

A transducer, or other acoustic wave generator, may generate an acoustic wave to physically displace one or both of the first surface (and a corresponding set of wells) and the buffer surface. In some embodiments, the acoustic wave may displace at least a portion of the first surface on which at least one set of the plurality of sets of wells is disposed. The acoustic wave may displace the set of wells in a first positive direction, return the set of wells to an original location, and then displace the set of wells in a second negative direction and return the set of wells to an original location; and so on for each cycle of the acoustic well. By transferring the particles at various locations of displacement, the particles may be shifted from an original well within a set of wells to an associated well in a different (e.g., adjacent) set of wells.

For instance, the particles may be transferred at a first displacement distance and a second displacement distance. The first displacement distance may correspond to a spacing distance between adjacent wells and the second displacement distance may be zero, relative to the static position. Accordingly, each of the particles may be shifted from an original well to an adjacent well. As will be appreciated, the sum of the absolute values of the first displacement distance and the second displacement distance may be any integer multiple of the spacing distance between adjacent wells.

In some embodiments, a reader or read module may read a data value based on the number of particles in a well after one or more shifts. For instance, in a row of eight wells, a read module may determine if a particle is present in a well at an end of the row. If a particle is present the read module may interpret it as a 1 and if a particle is not present the read module may interpret it as a 0. By shifting the eight bits of data one well at a time and reading the end well after each shift, the eight bits of data may be read sequentially. Such a data storage system, according to any combination of the various embodiments described herein, may be referred to as an acoustically driven particle shift register.

Any of a wide variety of particles may be utilized, including, without limitation, Buckminsterfullerene molecules (buckyballs), fullerenes, ionic fullerenes, heavy atoms, gold, lead, silver, iron, dimers, polyatomic molecules, fluorocarbons, metallic nanoparticles, dielectric nanoparticles, organic molecules, biological structures, viruses, cells, spores, and/or diatoms.

BRIEF DESCRIPTION OF THE DRAWINGS

Non-limiting and non-exhaustive embodiments of the disclosure are described herein with reference to the figures described below.

FIGS. 2A-2G illustrate a complete acoustic cycle of an acoustically driven shift register configured to shift physical particles, according to another embodiment.

FIG. 9 illustrates one embodiment of an acoustically driven shift register with a single row of wells.

FIG. 10 illustrates another embodiment of an acoustically driven shift register with two rows of wells in the form of physical cavities.

FIG. 11B illustrates a partial view of the acoustically driven shift register of FIG. 11A with one possible data representation system shown.

FIG. 12A illustrates another embodiment of an acoustically driven shift register in which a read module is configured to read data encoded using physical particles and a previously-read particles are configured to be shifted to a secondary location.

FIG. 12B illustrates cavities of the acoustically driven shift register physically divided into two wells.

FIG. 15A illustrates a flat surface of a buffer surface of one embodiment of an acoustically driven shift register.

FIG. 15C illustrates a buffer surface comprising two channels configured to constrain particles in at least a first direction.

FIG. 19A illustrates an embodiment of an acoustic wave relative to three sets of wells.

FIG. 19B illustrates an embodiment of a waveform relative to a plurality of sets of wells and particle transfer signals relative to the minimum and maximums of the acoustic wave.

DETAILED DESCRIPTION

Figure 1A:
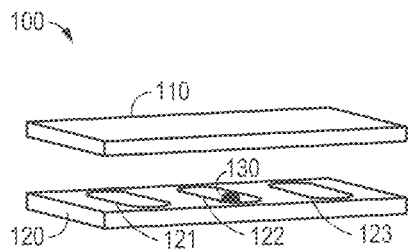
FIGS. 1A-1G illustrate a complete acoustic cycle of an acoustically driven shift register configured to shift physical particles, according to one embodiment.

The present disclosure provides various systems and methods associated with data storage devices and shift registers in which physical media represents bits and acoustic waves are used to shift the physical media. For example, in one embodiment, a plurality of particles are disposed within a matrix or set of wells on a first surface. Each of the wells within a set of wells may be spaced by a predetermined spacing distance from other sets of wells. Each set of wells may comprises a matrix of wells. The matrix may be any size, width, or length. For instance, the matrix of wells within a set of wells may be a 1×N matrix, where N is a whole number. The matrix may also be an M×N matrix, where M and N are whole numbers.

Physical particles may be selectively deposited in the wells to represent states in a multi-state data representation system. For example, the presence of a particle in a well may represent a 1 and the lack of a particle may represent a 0 in a binary data representation system. Alternative data representation schemes may be utilized as described and claimed herein.

For instance, a first range of particles in a well may represent a first state in a data representation system, a second range of particles in a well may represent a second state in the data representation system, and so on until an $N^{th}$ range of particles represents an $N^{th}$ state in the data representation system. As will be appreciated by one of skill in the art, any number of particles, combination of wells, threshold numbers/ranges of particles, and/or other permutations of wells and particles may be used to represent data using any of a wide variety of data representation schemes, including binary, ternary, hexadecimal, and other base-N data representation systems.

Embodiments may utilize any M of N scheme, where there are M particles and N wells, where M and N are both integers and where M is less than N. It will be appreciated that each permutation, or a subset of the possible permutations, of the placement of between 0 and M particles within the N wells may represent unique data representation states. For example, in a 2-of-5 embodiment, two particles may be used to represent various data states depending on in which of the 5 wells they are placed. Assuming the two particles are interchangeable, 10 different states may be represented in a 2-of-5 embodiment. If the particles are not interchangeable (i.e., they each have unique and detectable distinguishing property(ies), such as mass, polarity, charge, etc.), then 20 different states may be represented in a 2-of-5 embodiment.

Any M-of-N data representation may be utilized in conjunction with any of the various embodiments described herein. For instance, in a 3-of-6 embodiment, 20 different states may be represented, assuming the particles are used interchangeably. Likewise, in a 4-of-8 embodiment, 70 different states may be represented, again assuming the particles are used interchangeably.

In such embodiments, each set of wells may comprise N wells and M particles may be maintained within the N wells. The particles within a set of wells may be transferred to other corresponding wells within an adjacent set of wells by the wave transfer propagation described herein.

Throughout this disclosure, descriptions of a particle being transferred from one well to an adjacent well via wave motion and buffer transferring may be abstracted in nearly every instance to include a plurality of particles within a set of wells being transferred to wells within a neighboring set of wells. That is, while the present disclosure often describes each of a plurality of wells being transferred/displaced by one well spacing, it is appreciated that sets of well, in the tens, hundreds, or even thousands may be simultaneously transferred by one well-spacing displacement or by a displacement equal to tens, hundreds, or even thousands of well-spacing displacements.

As an example, a row in a matrix of wells may be read as a sequence of 0s and 1s based on whether a particle is in the well or not, or vice versa. Similarly, two rows may work in combination, such that each column is used to represent one of four states as each column is sequentially read row by row. In other embodiments, the number of particles in a well may be used to determine which of a plurality of states each well represents.

According to various embodiments, a matrix of wells may function as a shift register in which each well in a row (and/or column) is shifted in at least one direction. For example, a row of eight wells may include a sequence of particle/no-particle combinations to represent eight bits of information. The particles may be shifted along the row of wells such that after eight shifts, each of the particles has been transferred from a most significant bit location to a least significant bit location, or vice versa. The description below, provided with reference to the figures, includes numerous examples of acoustically-driven particle-based shift registers. In various embodiments, each of the wells in a row of wells on a first surface may be equally spaced by a predetermined spacing distance. In some embodiments, each of the wells in a column of wells may be equally spaced by a predetermined separation distance. The separation distance between wells in a column of wells may or may not be equal to the spacing distance between wells in a row of wells.

A buffer surface may be disposed parallel to the plane of the first surface. In various embodiments, at least some of the plurality of particles may be transferred from the first surface to the buffer surface when the first surface and/or the buffer surface is displaced a first displacement distance by the acoustic wave relative to one another. The plurality of particles may then be transferred from the buffer surface to the first surface when the first surface and/or buffer surface is displaced a second displacement distance by the acoustic wave relative one another. The first displacement distance and the second displacement distance may be chosen such that each of the plurality of particles is displaced by N wells (i.e. N spacing distances) in one direction, where N is an integer greater than 0.

In various embodiments, a transducer, or other acoustic wave generator, may generate an acoustic wave to physically displace the first surface and/or the buffer surface in the direction of a row or column of an N×M matrix of wells, where N and M are integers greater than 0.

In one embodiment, the acoustic wave may displace a first surface on which at least a portion of a plurality of wells is disposed. The acoustic wave may be configured to displace at least some of the wells at a peak of the acoustic wave and subsequently return the surface to an original location. The acoustic wave may displace the wells in a first positive direction, return the wells to an original location, and displace the wells in a second negative direction, and return the wells to an original location, and so on for each cycle.

As a specific example, the first displacement distance may correspond to a spacing distance between adjacent wells and the second displacement distance may be zero, relative to the static position. Accordingly, each of the particles may be shifted from an original well to an adjacent well. As will be appreciated, the sum of the absolute values of the first displacement distance and the second displacement distance, as determined from a static position, may be any integer multiple of the spacing distance between adjacent wells.

In some embodiments, a reader or read module may read a data value based on the number of particles in a well after one or more shifts. For instance, in a simple row of eight wells, a read module may determine if a particle is present in a well at an end of the row. If a particle is present the read module may interpret it as a 1 and if a particle is not present the read module may interpret it as a 0. By shifting the eight bits of data one well at a time and reading an end well after each shift, the eight bits of data may be read.

In various embodiments, the acoustic wave may be configured to longitudinally displace the first surface (and each of the associated wells) and/or the buffer surface a distance between approximately one nanometer and one micron. The frequency of the acoustic wave may be less than the acoustic propagation velocity divided by the spacing distance. In some embodiments, the frequency bandwidth of the acoustic wave may be at least ten times less than the acoustic propagation velocity divided by the spacing distance. Thus, the acoustic waveform may be configured with an amplitude and wavelength to move 10, 100, 1000, or more wells as a group. The width of a pulse and/or the slope from a maximum amplitude may be relatively large (wider) than a set (10, 100, 1000, or other) of wells. The acoustic wave may be generated at a predetermined interval, on demand, and/or continuously. The acoustic wave may be substantially sinusoidal, a square pulse, a triangular pulse, haversine, or another shaped waveform.

The acoustic wave may include one or more of a wide variety of waves types, including a bulk wave, a surface wave, a longitudinal or compression wave, a transverse or shear wave, and/or a surface acoustic wave (SAW). In some embodiments, waves may be utilized in place of acoustic waves as applicable throughout the disclosure. Other systems and methods of displacing the first surface and/or the buffer surface may also be employed as will be appreciated by one of skill in the art. For example, the first surface and/or the buffer surface may be mechanically or electromechanically displaced. In some embodiments, portions of the first surface and/or buffer surface may be displaced as a single continuous portion or as a plurality of portions that are sequentially, randomly, stochastically, and/or otherwise displaced.

Each well may be symmetrical or asymmetrical in length, width, depth, and/or shape. In some embodiments, a well may disposed within or on a channel or channel surface. multiple wells may be disposed within a channel. Each well may be configured to maintain one or more particles. Thus, an M×N matrix of bits, as described above as an M×N matrix of wells, may be represented using a 1×N matrix of channels, where each channel has M wells therein. Each well may be physically defined, defined based on the presence of an attractive force, or defined logically but not physically or by a potential and/or attractive force.

Wells may be defined by lithographic techniques, self-assembly, or a combination thereof. For example, an exposed or buried conductor may produce gradient E-fields and etched grooves or atomic steps may be used to define well positions along a conductor. In one embodiments, a stair-step type fracturing of a crystal may result in atomic level saw-tooth-like features that can be used to define wells. For example, silicon wafers may fracture with saw-tooth surfaces that are suitable as wells constrained in at least one direction.

As described above, each of the wells may be configured to maintain one or more particles. Similarly, a surface may include multiple wells arranged in an N×M matrix, where N and M are integers greater than 1. Each well may be configured to selectively maintain one or more particles. In various embodiments, each of the wells may comprise one or more physical cavities for maintaining one or more particles. Alternatively, each of the wells may be defined by a potential. That is, a well may be what is commonly referred to as a potential well configured to maintain one or more particles.

In various embodiments, each well may be configured to selectively maintain one or more particles via an attractive force, such as a magnetic force, a Casimir force, a Van der Walls force, a chemical bond, a covalent bond, an electrostatic ion interaction, a Keesom force, a Debye force, a London dispersion force, an ionic bond, and/or another maintaining force.

As described above, one or more of the plurality of particles may be transferred from the first surface (with the associated wells) to a buffer surface during a cycle of the acoustic wave. In various embodiments, particles may be transferred by generating an electric field to drive charged particles between the first surface and the buffer surface. A field gradient may be used to drive polarizable or polarized particles between the first surface and the buffer surface. In other embodiments or additionally, physical acceleration may be used to drive the particles between the first surface and the second surface. The acceleration may be generated using an acoustic wave, a chemical change, a temperature change, an electric field, a field gradient and/or a magnetic field.

For example, particles may be attracted to a first surface as long as a buffer surface is a spaced by a certain distance from the first surface. The particles may be more strongly attracted to the buffer surface (thereby causing them to transfer to the buffer surface) when the spacing distance between the buffer surface and the first surface is decreased.

In some embodiments, one or more electrodes may be associated with one or more portions of a buffer surface and/or first surface. The electrodes may be used to generate an electric field to drive charged particles between the first surface and the buffer surface. The first surface and the buffer surface may be separated by a gap distance that is between approximately 0.1 nanometer and 10 millimeters. The first surface may have any number of wells. The first surface and/or the buffer surface may include any number of portions configured to be displaced sequentially and/or independently. The first surface and the buffer surface may be substantially parallel to one another and potentially separated by one or more spacers, such as rollers, ball bearings, gases, liquids, spheres, cylinders, flexible walls, springs, levers, asymmetric rollers, and/or other separating features.

For example, in some embodiments, flexible separators or spacings may flex and bend during the wave-like motion of the first surface and/or a buffer surface.

In some embodiments, particles may be transferred from wells on the first surface to wells on the buffer surface, and vice versa. That is, the buffer surface may be configured with one or more wells to receive the particles during at least a portion of an acoustic wave cycle. For example, in one embodiment, the first surface includes a plurality of wells in a row along a longitudinal axis, where each well comprises a channel extending transverse to the longitudinal axis. In such an embodiment, the buffer surface may include one or more channels extending along the longitudinal axis. Thus, the channels on the first surface and the channels on the buffer surface may each limit the particles in one direction, but not necessarily the other. Specifically, the channels on the first surface may limit movement in the longitudinal direction and the channels on the buffer surface may limit the movement transverse to the longitudinal direction. The directions of the channels may be swapped to reverse the limiting directions for each of the first and buffer surfaces.

In some embodiments, the first surface may include a plurality of wells in a row along a longitudinal axis. In such an embodiment, each well may comprise a channel extending transverse to the longitudinal axis. Each of the channels may be divided into a plurality of wells, such that the first surface comprises an M×N array of wells, where M and N are integers greater than 0. The buffer surface may include channels in one direction (longitudinal or transverse channels) and/or a similar matrix of wells. Again, each of the wells may be a physical cavity to maintain the particles and/or represent a selectively attractive potential well.

As described herein, one or more particles may be used to represent a state in a multi-state data representation system. In some embodiments, the size, shape, and/or type of particle may be used to represent one or more states in a multi-state data representation. The size and shape of the particle utilized may be used to determine a suitable size for the first surface, a suitable size for the buffer surface, a suitable size for each well, a suitable size for each cavity, a suitable size for each well, a suitable channel width, a suitable channel depth, a suitable cavity width, a suitable cavity depth, a suitable gap distance between the first surface and the buffer surface, a suitable spacing distance between each of the wells, and/or other parameters of the storage system and/or components thereof. In some embodiments, the size and/or configuration of various portions of the storage system may be used to determine the size and/or type of particles used. For instance, the particle chosen may depend on whether the wells are physical cavities and/or potential wells.

Any of a wide variety of particles may be utilized, including, without limitation, Buckminsterfullerene molecules (buckyballs), fullerenes, ionic fullerenes, heavy atoms, gold, lead, silver, iron, dimers, polyatomic molecules, fluorocarbons, metallic nanoparticles, dielectric nanoparticles, organic molecules, biological structures, viruses, cells, spores, and/or diatoms.

In some embodiments, a plurality of particles representing states in a multi-state data representation system may be disposed within a plurality of wells. The wells may be uniformly spaced along a longitudinal axis of a first surface by a spacing distance. A transducer may be used to generate an acoustic wave with an amplitude corresponding to the spacing distance, such that the first surface and associated wells are displaced from a static position and/or relative to a buffer surface by at least one half the spacing distance along the longitudinal axis at a peak amplitude of the acoustic wave.

While the first surface is displaced by the first displacement distance, the plurality of particles may be transferred from the first surface to the buffer surface.

The plurality of particles may then be transferred back to the first surface when the first surface is displaced a second displacement distance by the acoustic wave relative to the static position and/or the buffer surface. The first displacement distance and the second displacement distance may be chosen such that each of the plurality of particles is shifted from an original well to different well.

In some embodiments, the particles may be transferred to the buffer surface before the first surface is displaced. The particles may be returned to the first surface after one or both of the first surface and the buffer surface are displaced such that each particle is shifted from an original well to a different well.

In various embodiments, a field control unit may be configured to selectively modify at least one field to transfer at least some of the plurality of particles between the buffer surface and the first surface. In some embodiments, an acoustic wave may displace the buffer surface instead of or in addition to the first surface. In such embodiments, the particles may be transferred between the first surface and the buffer surface prior to displacement of the buffer surface, during the displacement of the buffer surface, and/or after the displacement of the buffer surface.

As provided herein, shifting a plurality of particles from an original well to a different well (e.g., to an adjacent or other well) may include the following steps performed in any order: transferring the particles from the first surface to the buffer surface, displacing one or both of the buffer surface and the first surface, and returning the particles to the first surface from the buffer surface.

In one embodiment, a plurality of particles are disposed within wells that are uniformly spaced along a longitudinal axis of a first surface by a spacing distance. The plurality of particles may be positioned between the first surface and a substantially parallel buffer surface, where the buffer surface is separated from the first surface by a gap distance. One or more transducers may generate one or more acoustic waves with amplitudes corresponding to the spacing distance and/or the gap distance. The first surface and/or the buffer surface may be displaced by the acoustic wave(s) by at least the spacing distance along the longitudinal axis at a peak amplitude of at least one of the acoustic waves.

At least some of the plurality of particles may be secured to the buffer surface during at least a portion of the displacement of the first surface and/or the buffer surface as the first surface nears the buffer surface during a cycle of the acoustic wave. In various embodiments, the particles may be secured to the buffer surface for an integer multiple of the spacing distance, such that each of the plurality of particles is shifted from an original well to a different well during each cycle of the acoustic wave.

Many existing computing devices and infrastructures may be used in combination with the presently described data storage concepts. Data storage concepts such as fixed or variable signal delays may be implemented using the embodiments described herein as well. For example, a signal may be represented digitally or quantitatively (e.g., by the number of the wells filled with one (or more) particles.

Some of the infrastructure that can be used with embodiments disclosed herein is already available, such as general-purpose computers, computer programming tools and techniques, digital storage media, and communication links. A computing device may include a processor such as a microprocessor, a microcontroller, logic circuitry, and/or the like. A processor may include a special purpose processing device such as application-specific integrated circuits (ASIC), programmable array logic (PAL), programmable logic array (PLA), programmable logic device (PLD), field programmable gate array (FPGA), or other customizable and/or programmable device. The computing device may also include a machine-readable storage device such as non-volatile memory, static RAM, dynamic RAM, ROM, CD-ROM, disk, tape, magnetic memory, optical memory, flash memory, or other machine-readable storage medium. Various aspects of certain embodiments may be implemented using hardware, software, firmware, or a combination thereof. For instance, a combination of hardware, software, and/or firmware may be utilized to read, interpret, control and/or otherwise utilize the acoustically enabled particle shift register for data storage. For instance, the data values represented by particles (or lack of particles) in the presently described systems and methods may be converted to data streams that are readily interpreted, understood, and/or otherwise compatible with existing computer components and infrastructures.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Furthermore, the features, structures, and operations associated with one embodiment may be applicable to or combined with the features, structures, or operations described in conjunction with another embodiment. In other instances, well-known structures, materials, or operations are not shown or described in detail to avoid obscuring aspects of this disclosure. As described herein, each embodiment may be implemented without limitation by other embodiments. Alternatively, each embodiment may be implemented in combination with one or more other embodiments or portions of one or more other embodiments, as appropriate.

Thus, the following detailed description of the embodiments of the systems and methods of the disclosure is not intended to limit the scope of the disclosure, as claimed, but is merely representative of possible embodiments. In addition, the steps of a method do not necessarily need to be executed in any specific order, or even sequentially, nor do the steps need to be executed only once. For instance, one embodiment may include particles being transferred to the buffer surface before a shifting cycle of the acoustic wave while another embodiment may include the particles being transferred to the buffer surface after or during a shifting cycle of the acoustic wave.

FIGS. 1A-1G illustrate a complete acoustic cycle of an acoustically driven shift register 100 configured to shift physical particles 130, according to one embodiment. As illustrated, the acoustically driven shift register 100 may include a first surface 120 with a plurality of wells 121, 122, and 123 that are evenly spaced by a spacing distance. The acoustically driven shift register 100 may also include a buffer surface 110 that is substantially parallel to the first surface and is configured to receive and retain the physical particles 130 during at least a portion of an acoustic wave cycle.

Figure 1B:
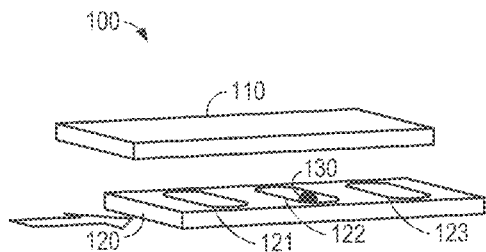

FIG. 1A illustrates the buffer surface 110 and the first surface 120 in a static position relative to one another. FIG. 1B illustrates the first surface 120 shifted to the right (also described herein as a positive direction) to a maximum displacement equal to one half of the spacing distance between the wells 121, 122, and 123. In some embodiments, a peak amplitude of the acoustic wave may cause the first surface to be shifted by one half of the spacing distance. In other embodiments, the peak amplitude of the acoustic wave may be less than, equal to, or greater than the spacing distance, as described herein.

Figure 1C:
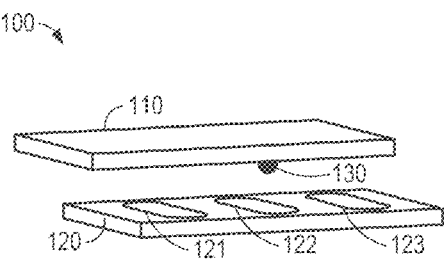
Figure 1D:
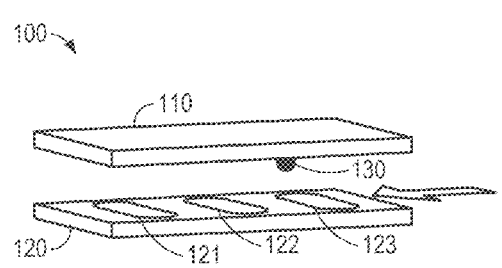
Figure 1E:
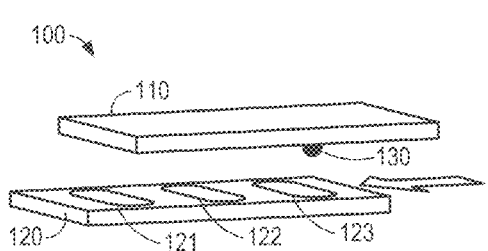

FIG. 1C illustrates the particle 130 transferred from the first surface 120 to the buffer surface 110 while the first surface 120 is shifted to the right by one half of the spacing distance. FIG. 1D illustrates the first surface 120 shifted back to an original or static position with respect to the buffer surface 110 by the acoustic wave at a midpoint of one cycle of the acoustic wave. FIG. 1E illustrates the first surface 120 shifted to the left (also described herein as a negative direction) to a negative maximum displacement equal to one-half of the spacing distance in the opposite direction of FIG. 1B.

Figure 1F:
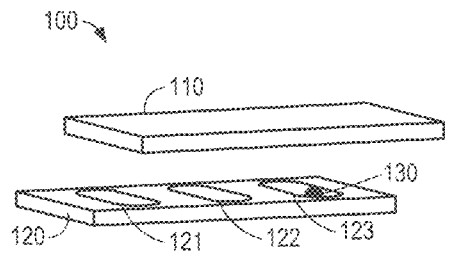
Figure 1G:
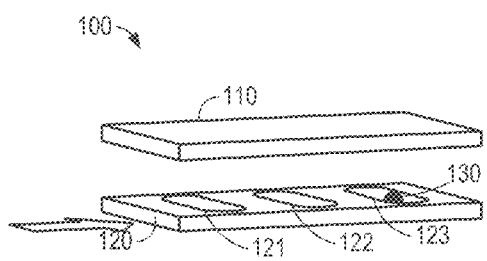

FIG. 1F illustrates the particle 130 transferred from the buffer surface 110 to the first surface 120 while the first surface 120 is shifted to the left by one half of the spacing distance. The steps illustrated in FIGS. 1A-1F show the particle 130 shifted from a middle well 122 to an adjacent well 123 during a single acoustic wave cycle. FIG. 1G illustrates the first surface 120 shifted back to the static position at the end of the acoustic wave cycle. As will be appreciated, if wells 121, 122 and 123 each had a particle in FIG. 1A, and they were all transferred to the buffer surface in FIG. 1C, and returned to the first surface in FIG. 1F, then each of the particles would be shifted to the right by a single well. Repeating the steps illustrated in FIGS. 1A-1G over multiple acoustic cycles would enable any number of particles to be shifted by any number of wells. By changing the order of shifting and transferring, by beginning the transfer cycle 180 degrees out of phase, and/or by modifying the direction of the shifting, one or more particles may be shifted in the opposite direction instead of or in addition to the direction illustrated.

The systems and methods illustrated in FIGS. 1A-1G may be abstracted to a higher level in which each of the wells 121, 122, and 123 represent a set of wells and the particle 130 represents a corresponding plurality of particles within the sets of wells 121-123. In such an embodiment, a first plurality of M particles is disposed within N wells 122. At least the set of wells 122 is shifted to the right (FIG. 1B). The acoustic wavelength may be such that the sets of wells 121 and 123 are not shifted simultaneously within the set of wells 122. Flexible members and/or the general elasticity of the material may facilitate this non-concurrent displacement. The plurality of particles may be transferred from the set of wells 122 to the buffer surface 110, at FIG. 1C. The plurality of particles may be returned to a different set of wells in FIG. 1F.

Just as the wells 121, 122, and 123 illustrated in FIGS. 1A-1G may be representative of sets of wells, where each set of wells comprises tens, hundreds, or even thousands of wells, the wells in many of the other figures, including at least FIGS. 2A-9 may also be understood as representative of sets of wells.

FIGS. 2A-2G illustrate a complete acoustic cycle of an acoustically driven shift register 200 configured to shift physical particles 230, according to another embodiment. As illustrated, an acoustically driven shift register 200 may include a first surface 220 with a plurality of wells 221, 222, and 223 that are evenly spaced by a spacing distance. The acoustically driven shift register 200 may also include a buffer surface 210 that is substantially parallel to the first surface 220 and is configured to receive and retain the physical particles 230 during at least a portion of an acoustic wave cycle.

FIG. 2A illustrates the buffer surface 210 and the first surface 220 in a static position relative to one another. FIG. 2B illustrates the first surface 220 shifted to the right (also described herein as a positive direction) to a maximum displacement equal to the spacing distance between the wells 221, 222, and 223. In some embodiments, a peak amplitude of the acoustic wave may cause the first surface to be shifted by the spacing distance. In other embodiments, the peak amplitude of the acoustic wave may be less than, equal to, or greater than the spacing distance.

FIG. 2C illustrates the particle 230 transferred from the first surface 220 to the buffer surface 210 while the first surface 220 is shifted to the right by the spacing distance. FIG. 2D illustrates the first surface 220 shifted back to an original or static position with respect to the buffer surface 210 by the acoustic wave at a midpoint of one cycle of the acoustic wave. FIG. 2E illustrates the particle 230 transferred from the buffer surface 210 to the first surface 220 at the midpoint of the cycle of the acoustic wave, such that the particle 230 is shifted one well to the right, i.e., from the well 222 to the well 223. FIG. 2F illustrates the first surface 220 shifted to the left (also described herein as a negative direction) to a negative maximum displacement equal to the spacing direction in the opposite direction of FIG. 2B.

As illustrated, the steps in FIGS. 2A-2E show the particle 230 shifted from a middle well 222 to an adjacent well 223 during the first half of a single acoustic wave cycle. FIG. 2G illustrates the first surface 220 shifted back to the static position at the end of the acoustic wave cycle. As will be appreciated, if wells 221, 222 and 223 each had a particle in FIG. 2A, and they were all transferred to the buffer surface in FIG. 2C, and returned to the first surface in FIG. 2F, then each of the particles would be shifted to the right by a single well. Repeating the steps illustrated in FIGS. 2A-2G over multiple acoustic cycles would enable any number of particles to be shifted by any number of wells. By changing the order of shifting and transferring, beginning the transfer cycle 180 degrees out of phase, and/or by modifying the direction of the shifting, one or more particles may be shifted in the opposite direction instead of or in addition to the direction illustrated.

FIGS. 3A-3G illustrate a complete acoustic cycle of an acoustically driven shift register 300 configured to shift physical particles 330, according to another embodiment. As illustrated, an acoustically driven shift register 300 may include a first surface 320 with a plurality of wells 321, 322, and 323 that are evenly spaced by a spacing distance. The acoustically driven shift register 300 may also include a buffer surface 310 that is substantially parallel to the first surface 320 and is configured to receive and retain the physical particles 330 during at least a portion of an acoustic wave cycle.

Figure 3A:
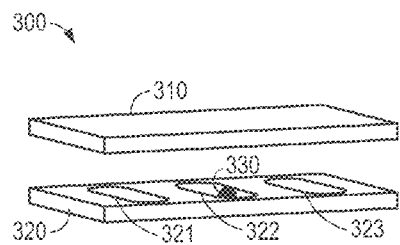
FIGS. 3A-3G illustrate a complete acoustic cycle of an acoustically driven shift register configured to shift physical particles, according to another embodiment.
Figure 3B:
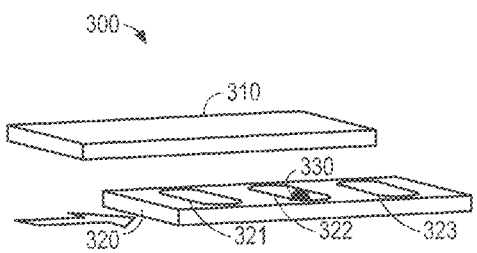

FIG. 3A illustrates the buffer surface 310 and the first surface 320 in a static position relative to one another with the particle 330 in a middle well 322. FIG. 3B illustrates the first surface 320 shifted to a maximum displacement equal to the spacing distance between the wells 321, 322, and 323. As described herein, a transducer, or other acoustic wave generator, may generate an acoustic wave to physically displace the first surface 320 during the acoustic wave cycle. In some embodiments, a peak amplitude of the acoustic wave may cause the first surface to be shifted by the spacing distance. In other embodiments, the peak amplitude of the acoustic wave may be less than, equal to, or greater than the spacing distance.

Figure 3C:
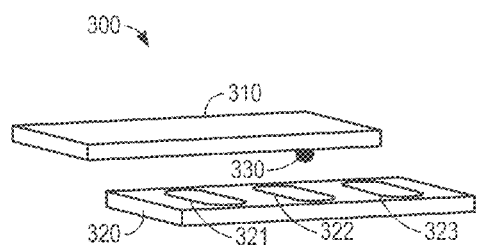
Figure 3D:
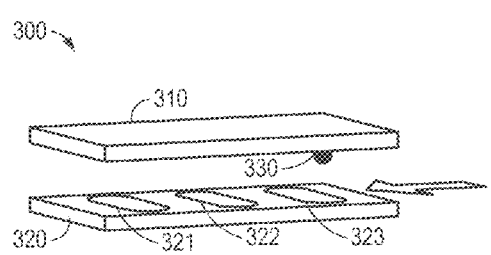

FIG. 3C illustrates the particle 330 transferred from the first surface 320 to the buffer surface 310 when the first surface 320 is shifted to the right by the spacing distance. FIG. 3D illustrates the first surface 320 shifted back to an original or static position with respect to the buffer surface 310 by the acoustic wave at a midpoint of one cycle of the acoustic wave.

Figure 3E:
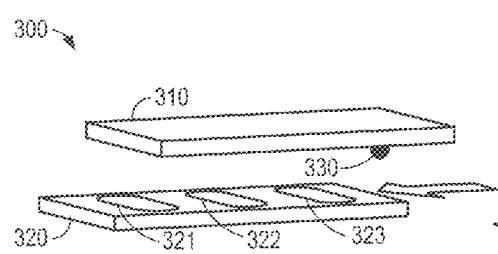

FIG. 3E illustrates the first surface 320 shifted to the left to a negative maximum displacement equal to the spacing direction in the opposite direction of FIG. 3B.

Figure 3F:
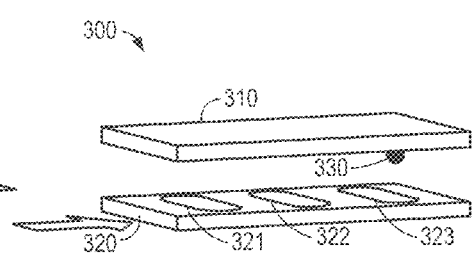
Figure 3G:
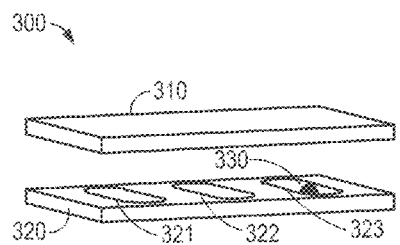

FIG. 3F illustrates the first surface 320 shifted back to the static position at the end of the acoustic wave cycle. FIG. 3G illustrates the particle 330 transferred from the buffer surface 310 to the first surface 320 at the end of the cycle of the acoustic wave, such that the particle 330 is shifted one well to the right, i.e., from the well 322 to the well 323. The steps illustrated in FIGS. 3A-3G illustrate the particle 330 shifted from a middle well 322 to an adjacent well 323 during the first half of a single acoustic wave cycle. As will be appreciated, if wells 321, 322 and 323 each had a particle in FIG. 3A, and they were all transferred to the buffer surface in FIG. 3C, and returned to the first surface in FIG. 3G, then each of the particles would be shifted to the right by a single well. Repeating the steps illustrated in FIGS. 3A-3G over multiple acoustic cycles would enable any number of particles to be shifted by any number of wells. By changing the order of shifting and transferring, beginning the transfer cycle 180 degrees out of phase, and/or by modifying the direction of the shifting, one or more particles may be shifted in the opposite direction instead of or in addition to the direction illustrated.

FIGS. 4A-4G illustrate a complete acoustic cycle of an acoustically driven shift register 400 configured to shift physical particles 430, according to another embodiment. As illustrated, an acoustically driven shift register 400 may include a first surface 420 with a plurality of wells 421, 422, and 423 that are evenly spaced by a spacing distance. The acoustically driven shift register 400 may also include a buffer surface 410 that is substantially parallel to the first surface 420 and is configured to receive and retain the physical particles 430 during at least a portion of an acoustic wave cycle.

Figure 4A:
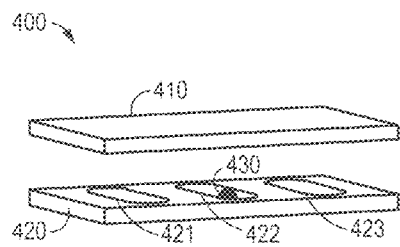
FIGS. 4A-4G illustrate a complete acoustic cycle of an acoustically driven shift register configured to shift physical particles, according to another embodiment.
Figure 4B:
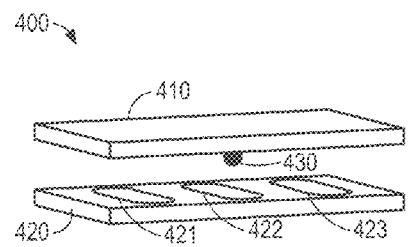
Figure 4C:
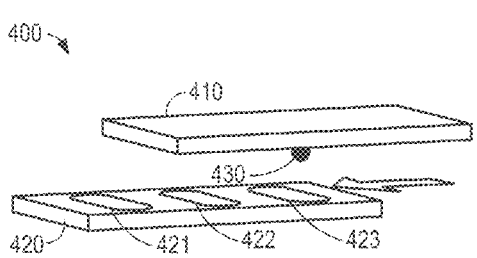

FIG. 4A illustrates the buffer surface 410 and the first surface 420 in a static position relative to one another. FIG. 4B illustrates the particle 430 transferred from the first surface 420 to the buffer surface 410 while the first surface 420 is in the static position. FIG. 4C illustrates the first surface 420 shifted, by an acoustic wave, to the left to a negative maximum displacement equal to the spacing distance between the wells 421, 422, and 423. In some embodiments, a peak amplitude of the acoustic wave may cause the first surface to be shifted by the spacing distance. In other embodiments, the peak amplitude of the acoustic wave may be less than, equal to, or greater than the spacing distance.

Figure 4D:
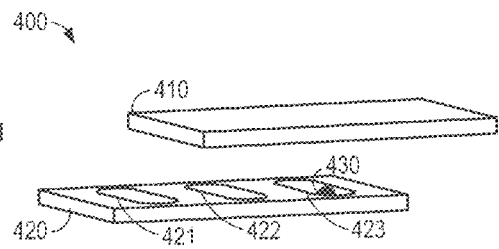
Figure 4E:
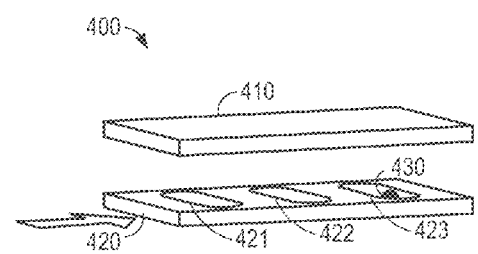
Figure 4F:
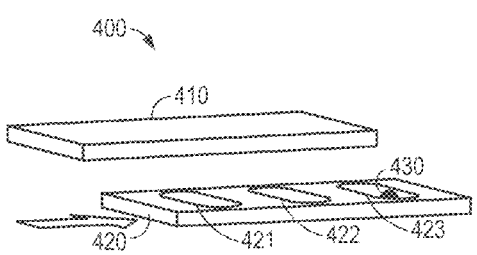

FIG. 4D illustrates the particle 430 transferred from the buffer surface 210 to the first surface 410 while the first surface 420 is acoustically shifted to the left by the spacing distance, such that the particle 430 is shifted one well to the right, i.e., from the well 422 to the well 423. FIG. 4E illustrates the first surface 420 shifted back to an original or static position with respect to the buffer surface 410 by the acoustic wave at a midpoint of one cycle of the acoustic wave. FIG. 4F illustrates the first surface 420 shifted to the right to a maximum displacement equal to the spacing direction in the opposite direction of FIG. 4C.

Figure 4G:
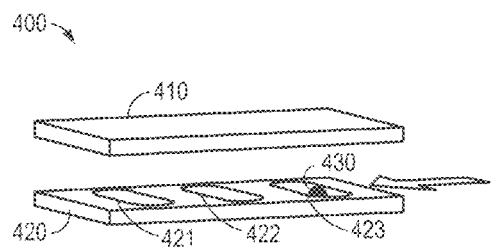

As illustrated, the steps in FIGS. 4A-4D show the particle 430 shifted from a middle well 422 to an adjacent well 423 during the first half of a single acoustic wave cycle. FIG. 4G illustrates the first surface 420 shifted back to the static position at the end of the acoustic wave cycle. As will be appreciated, any number of particles can be shifted from and between any number of wells sequentially, randomly, and/or in any other order via any of the methods described herein. For instance, repeating the steps illustrated in FIGS. 4A-4G over multiple acoustic cycles would enable any number of particles to be shifted by any number of wells. By changing the order of shifting and transferring, beginning the transfer cycle 180 degrees out of phase, and/or by modifying the direction of the shifting, one or more particles may be shifted in the opposite direction instead of or in addition to the direction illustrated.

FIGS. 5A-5G illustrate a complete acoustic cycle of an acoustically driven shift register 500 configured to shift physical particles 530, according to another embodiment. As illustrated, an acoustically driven shift register 500 may include a first surface 520 with a plurality of wells 521, 522, and 523 that are evenly spaced by a spacing distance. The acoustically driven shift register 500 may also include a buffer surface 510 that is substantially parallel to the first surface 520 and is configured to receive and retain the physical particles 530 during at least a portion of an acoustic wave cycle.

Figure 5A:
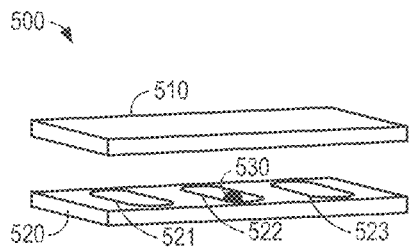
FIGS. 5A-5G illustrate a complete acoustic cycle of an acoustically driven shift register configured to shift physical particles, according to another embodiment.
Figure 5B:
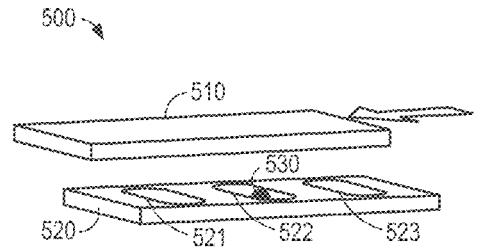
Figure 5C:
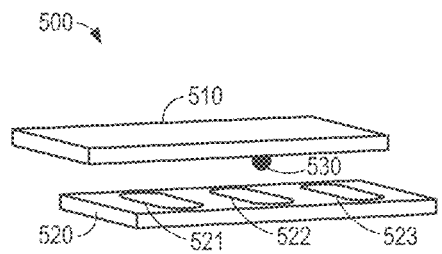
Figure 5D:
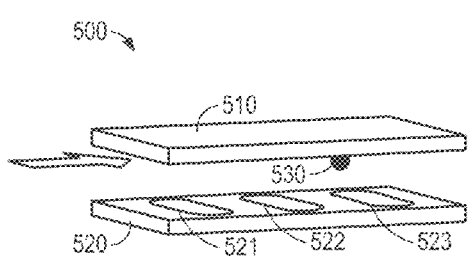

FIG. 5A illustrates the buffer surface 510 and the first surface 520 in a static position relative to one another. FIG. 5B illustrates the buffer surface shifted to the left by an acoustic wave to a negative displacement distance equal to one half of the spacing distance. FIG. 5C illustrates the particle 530 transferred from the first surface 520 to the buffer surface 510 while the buffer surface 510 is negatively displaced by one half of the spacing distance. FIG. 5D illustrates the buffer surface 510 returned to the static position with the particle 530 secured to the buffer surface 510 in between the location of well 522 and well 523.

Figure 5E:
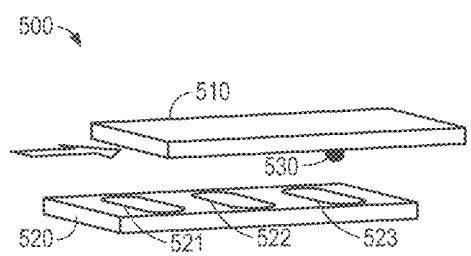
Figure 5F:
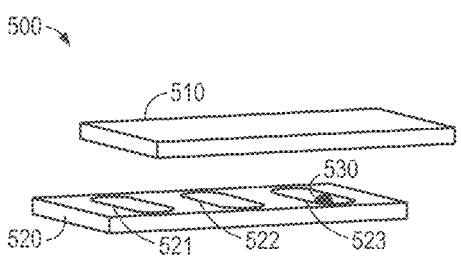
Figure 5G:
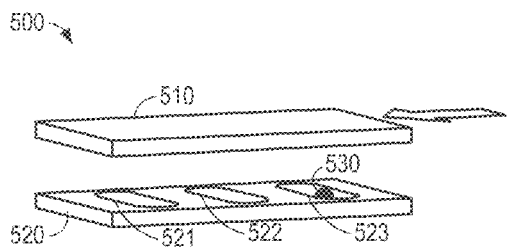

FIG. 5E illustrates the buffer surface 510 shifted to the right by one half of the spacing distance, such that the particle 530 secured to the buffer surface 510 is directly over the well 523 on the first surface 520. FIG. 5F illustrates the particle transferred from the buffer surface 510 to the first surface 520 while the buffer surface 520 is shifted to the right by one half of the spacing distance by the acoustic wave. FIG. 5G illustrates the buffer surface 510 returned to the static condition at the completion of the acoustic wave cycle.

FIGS. 6A-6G illustrate a complete acoustic cycle of an acoustically driven shift register 600 configured to shift physical particles 630, according to another embodiment. An acoustically driven shift register 600 may include a first surface 620 with a plurality of wells 621, 622, and 623 that are evenly spaced by a spacing distance. The acoustically driven shift register 600 may also include a buffer surface 610 that is substantially parallel to the first surface 620 and is configured to receive and retain the physical particles 630 during at least a portion of an acoustic wave cycle.

Figure 6A:
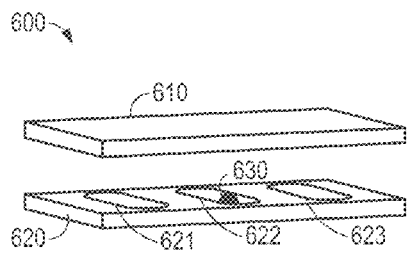
FIGS. 6A-6G illustrate a complete acoustic cycle of an acoustically driven shift register configured to shift physical particles, according to another embodiment.
Figure 6B:
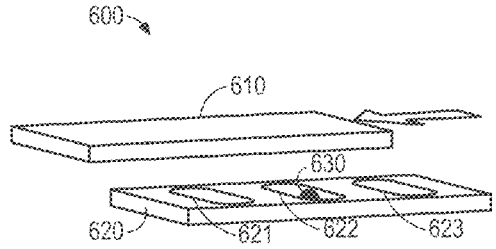
Figure 6C:
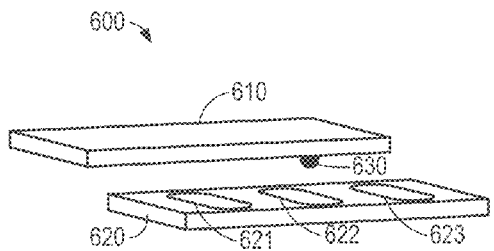
Figure 6D:
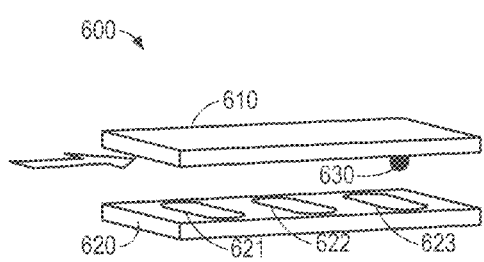

FIG. 6A illustrates the buffer surface 610 and the first surface 620 in a static position relative to one another. FIG. 6B illustrates the buffer surface 610 shifted to the left by an acoustic wave to a negative displacement distance equal to the spacing distance. FIG. 6C illustrates the particle 630 transferred from the first surface 620 to the buffer surface 610 while the buffer surface 610 is negatively displaced by the spacing distance. FIG. 6D illustrates the buffer surface 610 returned to the static position with the particle 630 secured to the buffer surface 610 directly above well 523.

Figure 6E:
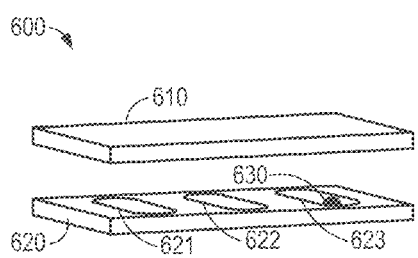
Figure 6F:
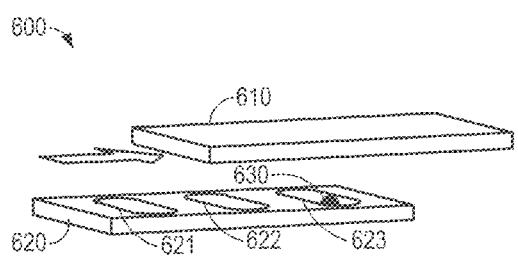
Figure 6G:
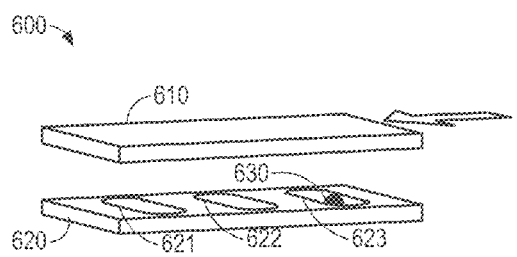

FIG. 6E illustrates the particle 630 transferred from the buffer surface 610 to the first surface 620 while the buffer surface 610 is in the static position. FIG. 6F illustrates the buffer surface 610 shifted to the right by the spacing distance by the acoustic wave during the final quarter of the acoustic wave. FIG. 6G illustrates the buffer surface 610 returned to the static condition at the completion of the acoustic wave cycle.

FIGS. 7A-7H illustrate a complete acoustic cycle of an acoustically driven shift register 700 configured to shift physical particles 730, according to another embodiment. An acoustically driven shift register 700 may include a first surface 720 with a plurality of wells 721, 722, and 723 that are evenly spaced by a spacing distance. The acoustically driven shift register 700 may also include a buffer surface 710 that is substantially parallel to the first surface 720 and is configured to receive and retain the physical particles 730 during at least a portion of an acoustic wave cycle.

Figure 7A:
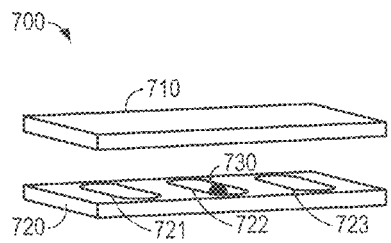
FIGS. 7A-7H illustrate a complete acoustic cycle of an acoustically driven shift register configured to shift physical particles, according to another embodiment.
Figure 7B:
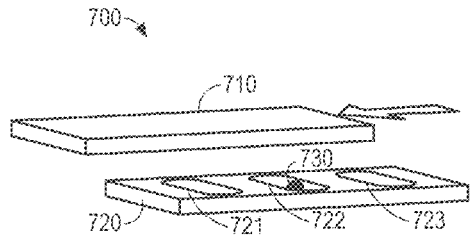
Figure 7C:
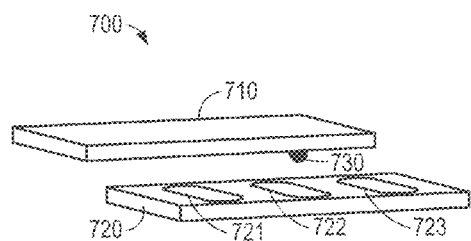
Figure 7D:
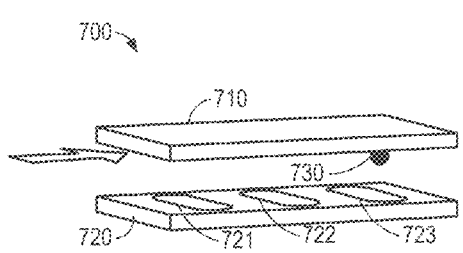

FIG. 7A illustrates the buffer surface 710 and the first surface 720 in a static position relative to one another. FIG. 7B illustrates the buffer surface shifted to the left by an acoustic wave to a negative displacement distance equal to the spacing distance. FIG. 7C illustrates the particle transferred to the buffer surface 710 at the first quarter of the acoustic wave. FIG. 7D illustrates the buffer surface 710 returned to the static position.

Figure 7E:
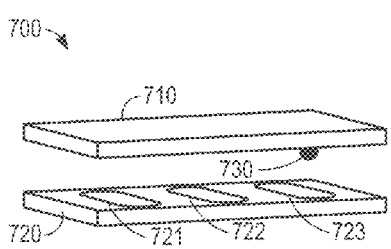
Figure 7F:
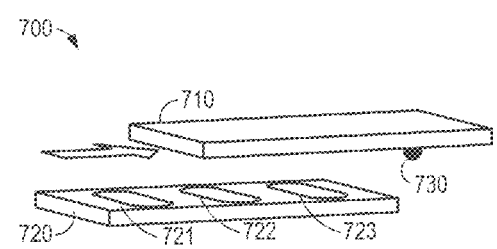
Figure 7G:
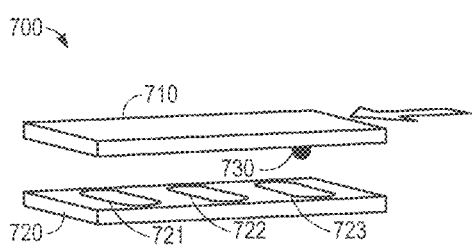
Figure 7H:
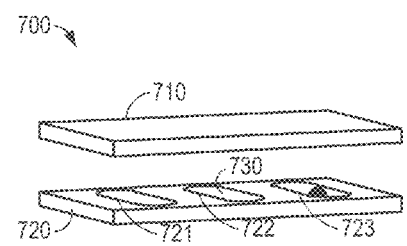

FIG. 7E illustrates the particle 730 secured to the buffer surface 710 directly above well 723. FIG. 7F illustrates the buffer surface 710 shifted to the right by the spacing distance by the acoustic wave during the final quarter of the acoustic wave. FIG. 7G illustrates the buffer surface 710 returned to the static condition at the completion of the acoustic wave cycle. FIG. 7H illustrates the particle 730 transferred from the buffer surface 710 to the first surface 720, such that the particle is ultimately transferred from an original well, 722, to a different well, 723.

FIGS. 8A-8G illustrate a complete acoustic cycle of an acoustically driven shift register 800 configured to shift physical particles 830, according to another embodiment. An acoustically driven shift register 800 may include a first surface 820 with a plurality of wells 821, 822, and 823 that are evenly spaced by a spacing distance. The acoustically driven shift register 800 may also include a buffer surface 810 that is substantially parallel to the first surface 820 and is configured to receive and retain the physical particles 830 during at least a portion of an acoustic wave cycle.

Figure 8A:
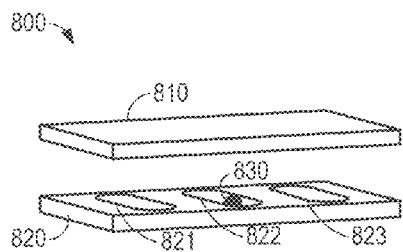
FIGS. 8A-8G illustrate a complete acoustic cycle of an acoustically driven shift register configured to shift physical particles, according to another embodiment.
Figure 8B:
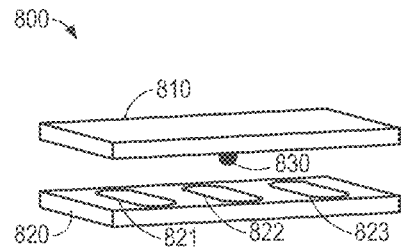
Figure 8C:
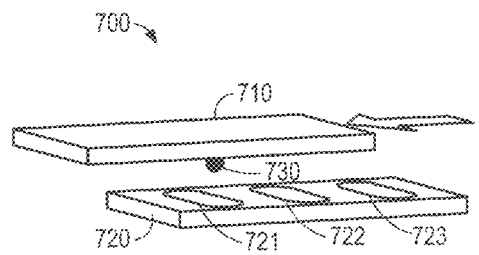
Figure 8D:
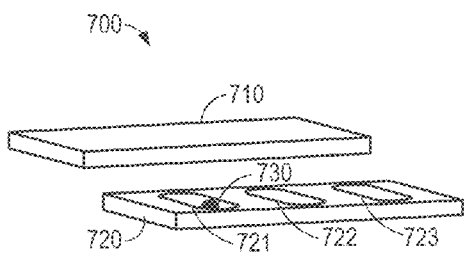
Figure 8E:
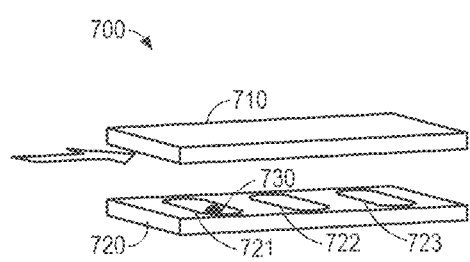
Figure 8F:
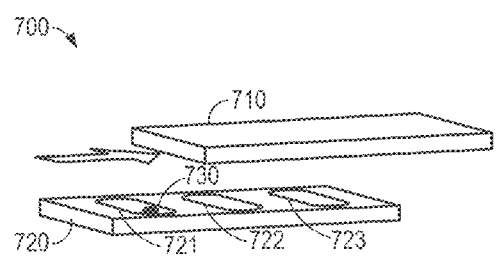
Figure 8G:
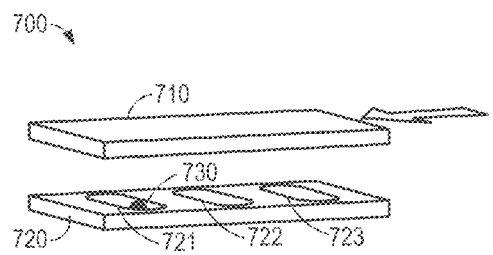

FIG. 8A illustrates the buffer surface 810 and the first surface 820 in a static position relative to one another. FIG. 8B illustrates the particle 830 transferred from the first surface 820 to the buffer surface 810. FIG. 8C illustrates the buffer surface 810 shifted to the left by an acoustic wave to a negative displacement distance equal to the spacing distance. FIG. 8D illustrates the particle transferred from the buffer surface 810 to the first surface 820. FIGS. 8E, 8F, and 8G illustrate the remainder of the complete cycle of the acoustic wave.

FIG. 9 illustrates one embodiment of an acoustically driven shift register 900 with a single row of wells 925A-925Q disposed on a first surface 920 parallel to a buffer surface 910. As described herein, each well 925A-925Q may comprise a channel configured with a front portion (toward the front of the page) and a rear portion (into the page). According to various embodiments, each of the wells and particles may be used to represent data states. For instance in one embodiment, each well with a particle may represent a 1 in a binary data representation system and each well without a particle may represent a 0 in the binary data representation system. In another embodiment, each well with a particle toward one side of a channel (i.e., front or rear of the well) represents a first data state and each well with a particle toward the other side of the channel represents a second data state. The may be considered a 1-of-2 embodiment in which a particle in a first well represents a first data state, a particle in a second well represents a second data state. Further still, in some embodiments, no particle in either well represents a third data state and a particle in each well represents a fourth state.

In yet another embodiment, each empty well represents a first data state, each well with a particle in a first portion of the well (where the well comprises a channel) comprises a second data state, and each well with a particle in a second portion of the well comprises a third data state. Particles in additional portions of the channel may be used to represent any number of data states.

As described herein, the wells may be symmetrical or asymmetrical in length, width, depth, and/or shape. In some embodiments, a well may comprise a channel. The channel may have multiple wells within the channel, where each well is configured to maintain one or more particles, selectively. Thus, an M×N matrix of bits, as described above as an M×N matrix of wells, may be represented using a 1×N matrix of channels, where each channel has M wells therein. Each well may be physically defined, defined based on the presence of an attractive force, or defined logically but not physically or by potential/force.

Particles may be shifted within the wells 925A-925Q according to any of the various embodiments described herein, including those described in conjunction with FIGS. 1A-8G. In some embodiments, after each shift of the particles within wells 925A-925Q, a read module 940 may be configured to detect the presence of a particle and/or the location of the particle within the channel/well 925R. The read module 940 may communicate with a processor or other computer device via communication channel 930, which may be analog or digital. In some embodiments, signals from the read module 940 may be process by some combination of analog and digital circuitry for noise reduction, error correction, encoding, synchronization, etc. In some embodiments, particles may be configured to be shifted by more than one well at a time and a read module and/or write module may be configured to read and/or write more than one well at a time.

In one embodiment, a particle within a well represents a 1 and a lack of a particle within a well represents a 0. The particles may be shifted from left to right. In such an embodiment, and as currently illustrated in FIG. 9, the read module may output a 1, since the well 925R has a particle in it. After each subsequent shift, the read module would output, sequentially: 0, 0, 1, 1, 0, 0, 1, 1, 0 0, 1, 0, 1, 0, 1, 1, 0.

FIG. 10 illustrates another embodiment of an acoustically driven shift register 1000 with two rows of wells 1025A-1025Q and 1035A-1035Q in the form of physical cavities. The physical cavities may be disposed in the first surface 1020 that is parallel to a buffer surface 1010. The particles may be shifted according to any of the various embodiments described herein using acoustic waves. The particles may be used to represent any number of data states using any combination of particles and wells. For instance, in some embodiments, particles in the first row of wells 1035A-1035Q may represent a first data state and particles in the second row of wells 1025A-1025Q may represent a second data state. In some embodiments, if a particle is present in two corresponding wells, i.e., 1035A and 1025A, then an error may be detected.

By extension, any set of N wells, either in a single row, a single well location across multiple rows, or any combination of row and column positions, that are shifted together, may be considered as a single storage location. Each such storage location may contain a fixed number, M, of particles, with the specific distribution of the M particles among N wells representing a data value. Detection of a number of particles not equal to one of the possible expected number of particles may constitutes an error. In such an embodiment, an M-of-N storage approach maintains a fixed total number of particles within the storage device for any stored data values.

Other storage encodings providing additional error detection or error correction capability, or optimizing data storage density while meeting a constraint other than a fixed number of particles per storage location (e.g., a constant average number of particles) will be apparent to those skilled in the art, as similar to encodings used in other data storage data communications systems As in previous embodiments, a read module 1040 may be configured to determine a data state of each well after each shift of the particles within the wells 1025A-1025Q and 1035A-1035Q to the wells 1025R and 1035R.

Figure 11A:
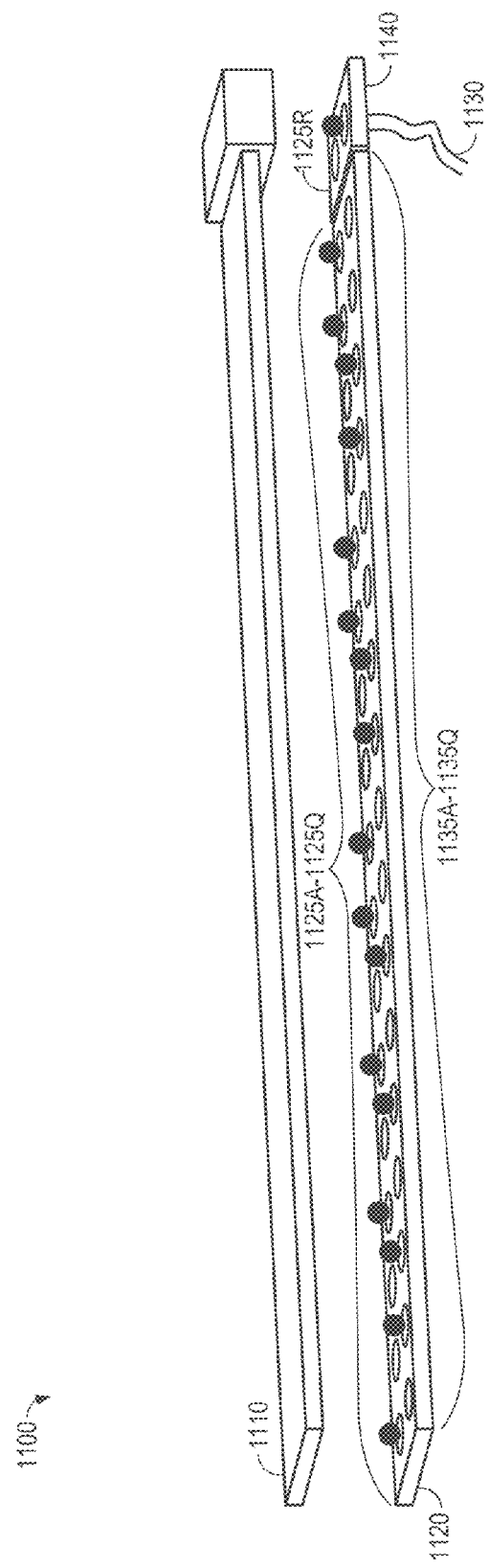
FIG. 11A illustrates another embodiment of an acoustically driven shift register with two rows of wells in the form of potential wells.

FIG. 11A illustrates another embodiment of an acoustically driven shift register with a first surface 1120 and a buffer surface 1110. The first surface may have a plurality of rows of wells 1125A-1125Q and 1135A-1135Q. In the illustrated embodiment, the wells 1125A-1125Q and 1135A-1135Q may comprise potential wells configured to maintain particles via any of a wide variety of charged particles, polarized particles, electric fields, attractive forces, and/or other forces as provided herein and the like.

FIG. 11B illustrates a partial view of the acoustically driven shift register of FIG. 11A with one possible data representation system shown. The illustrated embodiment includes a partial view of a buffer surface 1110 and a first surface 1120. The position of particles on the potential wells 1125A-1125H and 1135A-1135H may be used to represent any of a wide variety of data states according to any of a wide variety of data representation systems. In the illustrated example, a particle in a first, forward position may represent a 1 and a particle in a second, rear position may represent a 0. In some embodiments, if particles are present in both wells within in a column (i.e., transverse to the rows 1125A-1125H and 1135A-1135H), such as in both 1135A and 1125A, then an error may be detected.

FIG. 12A illustrates another embodiment of an acoustically driven shift register including a central read module 1240, a first surface 1220, and a buffer surface 1210. FIG. 12A illustrates particles in black as particles prior to shifting completely to the right and particles in grey as the particles after they have all been shifted to the right.

As illustrated, particles may be shifted using an acoustic wave from a primary storage side of wells 1235A-1235H to a secondary storage side 1245A-1245H. As the particles are shifted from the primary wells 1235A-1235H to the secondary wells 1245A-1245H via the read module well 1240, the read module 1240 may read the data encoded using the particle and well combinations.

FIG. 12B illustrates a plurality of wells in which each well comprises a channel that is physically divided into two wells, such that two rows of wells 1255A-1255H and 1235A-1235H exist. The read module 1240 may also include a well that is divided into two wells 1241 and 1242. The read module 1240 may communicate with a computer module via a communication line 1250.

Figure 12C:
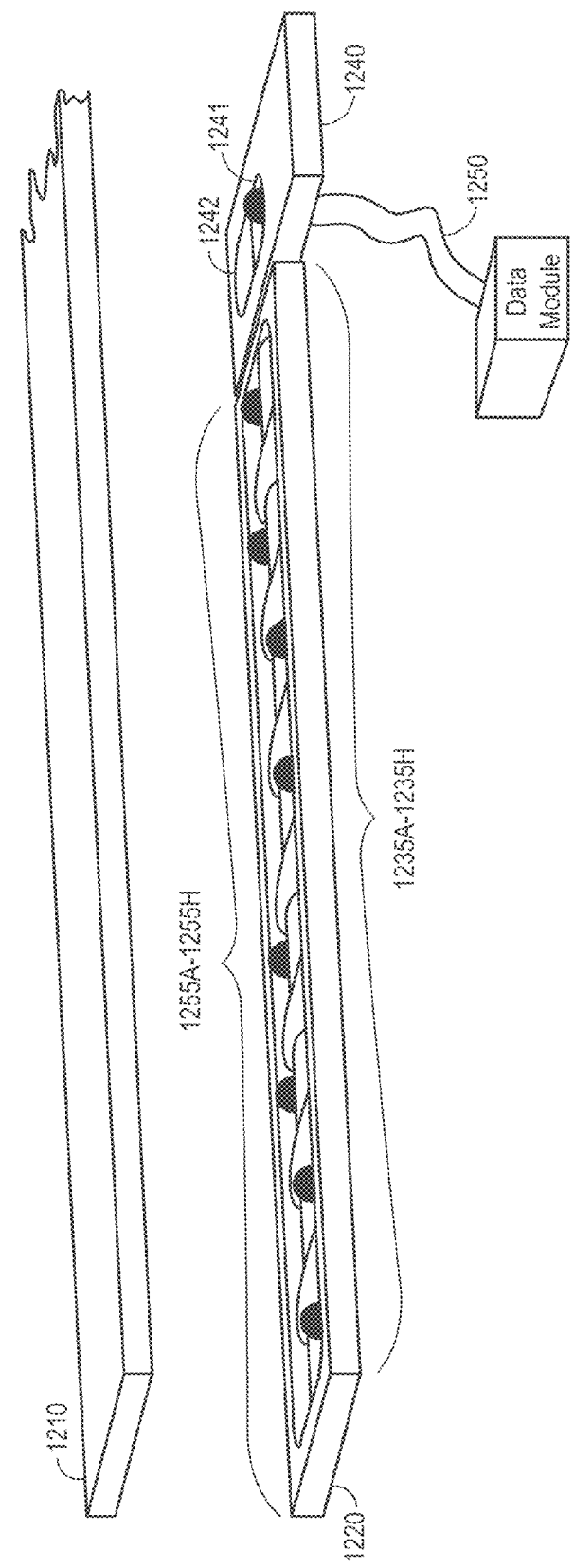
FIG. 12C illustrates wells of the acoustically driven shift register in a plurality of wells.

FIG. 12C illustrates a plurality of wells in the form of a matrix of physically divided wells 1255A-1255H and 1235A-1235H. In other embodiments, each of the wells may be a physical cavity and in other embodiments each of the wells may be a potential well or other attractive well configured to selectively maintain one or more particles. It is also of note that in each of the illustrated embodiments, each of the wells is shown with zero or one particle. However, each well, whether physical or potential, may be configured to maintain any number of particles.

Additionally, in some embodiments, the read module 1240 may alternatively or also be configured as a write module.

In other embodiments, a stand-alone write-module may be included in addition to the illustrated read module. A write module may be configured to write by moving, removing, and/or adding a particle to well 1241 and/or 1242. For example, the write module may be configured to add a particle to one of the wells 1241 and/or 1242. In another embodiment, the write module may be configured to move a particle between wells 1241 and 1242.

In some embodiments, particles may be emplaced during fabrication. However, in other embodiments, the memory system includes a write module that moves particles from a storage bin (e.g., a hopper) to a well. In some embodiments, the write module may be adjacent to the read module, or a single module may perform both functions.

In some embodiments, particles may be reversibly moved (i.e., shifted through the write module in order 1, 2, . . . N and then shifted back through the read module in reverse order N, . . . 2, 1), a configuration known as "last in first out."

Alternatively, write and read modules may be separated by the length of the channels or by a predetermined number of wells. In such an embodiment, the device may operate in a "first in first out" mode.

In some embodiments, adjacent rows or sets of rows may be configured to shift in opposite directions. Read and write modules may be configured to transfer actual particles, or to transfer data values, from left-going, to right-going columns, forming closed loops.

Figure 13:
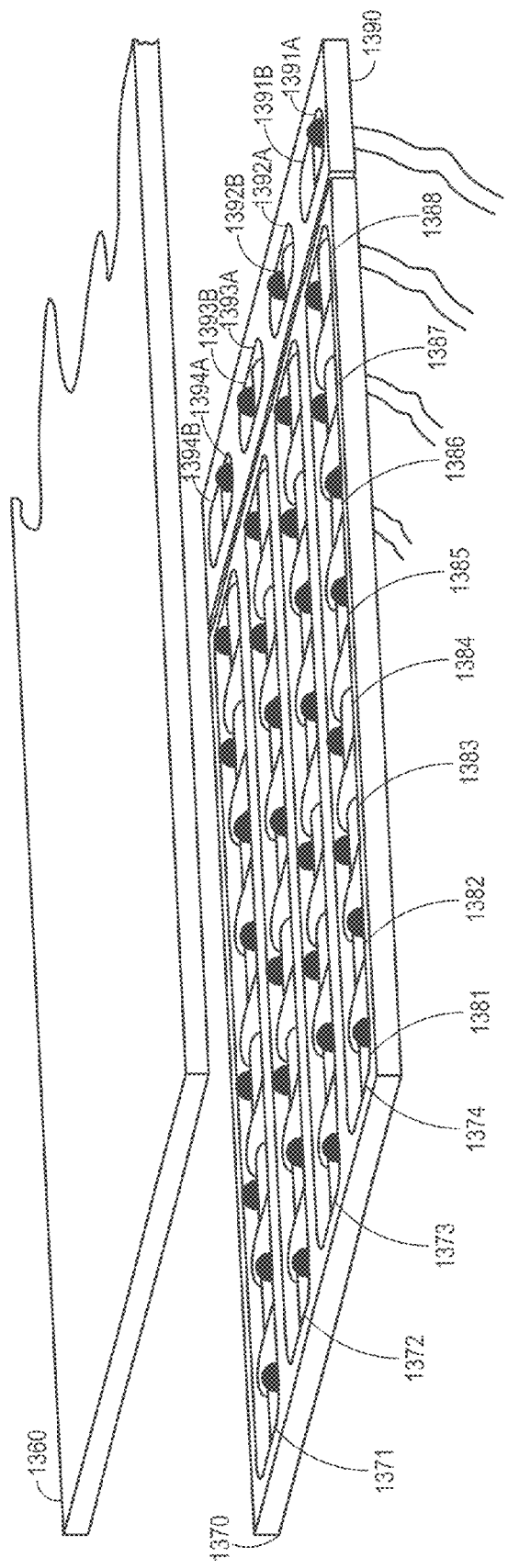
FIG. 13 illustrates another embodiment of an acoustically driven shift register in which wells are arranged into an N×M matrix of wells, with each well configured to maintain one or more physical particles.

FIG. 13 illustrates another embodiment of an acoustically driven shift register with a buffer surface 1360 and a first surface 1370 with a matrix of wells arranged in rows 1371, 1372, 1373, and 1374 and columns 1381, 1382, 1383, 1384, 1385, 1386, 1387, and 1388. Each well may be configured to maintain one or more particles and any combination of particles and wells may be used to represent any number of states in a multi-state data representation system. As particles within the wells are shifted from the left to the right, they may be shifted to wells 1391A-1394B in read/write module 1390. The read/write module 1390 may detect particles to read them and move, remove, replace, and/or add particles to write. The wells may be arranged in an N×M matrix in which wells are configured as channels and/or distinct wells in the form of physical cavities or potential wells.

Figure 14:
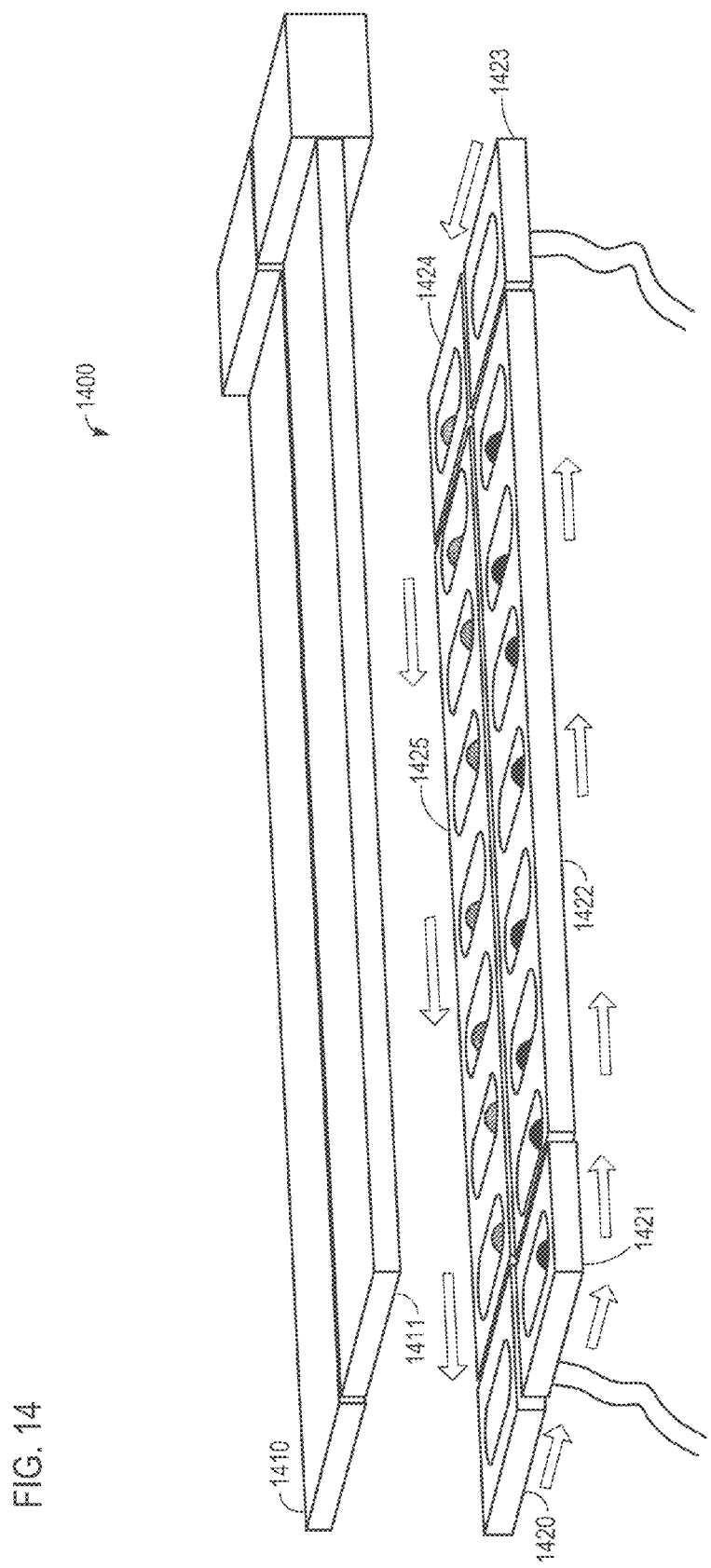
FIG. 14 illustrates another embodiment of an acoustically driven shift register in which particles are read and then fed in a loop between a primary location and a secondary location.

FIG. 14 illustrates another embodiment of an acoustically driven shift register 1400 in which particles are read by a read module 1420, 1421, 1423, and/or 1424 and then fed in a loop between a primary storage side 1422 and a secondary storage side 1425. In the illustration, the black particles represent the locations prior to shifting around the loop in the direction of the arrows. Each particle may be read by a read module 1423 and/or 1424 as they are shifted. The particles may be shifted using an acoustic wave to move one of the buffer surface(s) 1410 and 1411 and/or portions of the first surface 1420-1425.

As described herein, by transferring the particles during various portions of the acoustic wave cycle, the particles may be shifted around the loop of wells. The end portions 1420, 1421, 1423, and 1424 may be configured to transversely translate relative to the main portions 1422 and 1425. The acoustic wave may then cause end portions 1420, 1421, 1423, and 1424 to move in concert with main portions 1422 and 1425. For example, particles may be shifted from portion 1420 to portion 1421. Alternatively, portion 1420, for example, may be translated such that it is aligned with and translates with main portion 1422.

FIG. 15A illustrates a flat surface 1511 of a buffer surface 1510 of one embodiment of an acoustically driven shift register 1500. As in previous embodiments, a first surface 1520 may include a plurality of wells on a surface 1525. Each of the wells may be configured as or with channels and/or wells. Moreover, each of the wells may be configured as a physical well or as a potential well. An acoustic wave may be configured to enable particles to be shifted from well to well and be read and/or written by read/write module 1520 and wells 1531 and 1532.

In the illustrated embodiment, the flat surface 1511 of the buffer surface 1510 may be configured to maintain the particles during at least a portion of a cycle of an acoustic wave as one or both of the buffer surface 1510 and the first surface 1520 are physically displaced relative to one another.

Figure 15B:
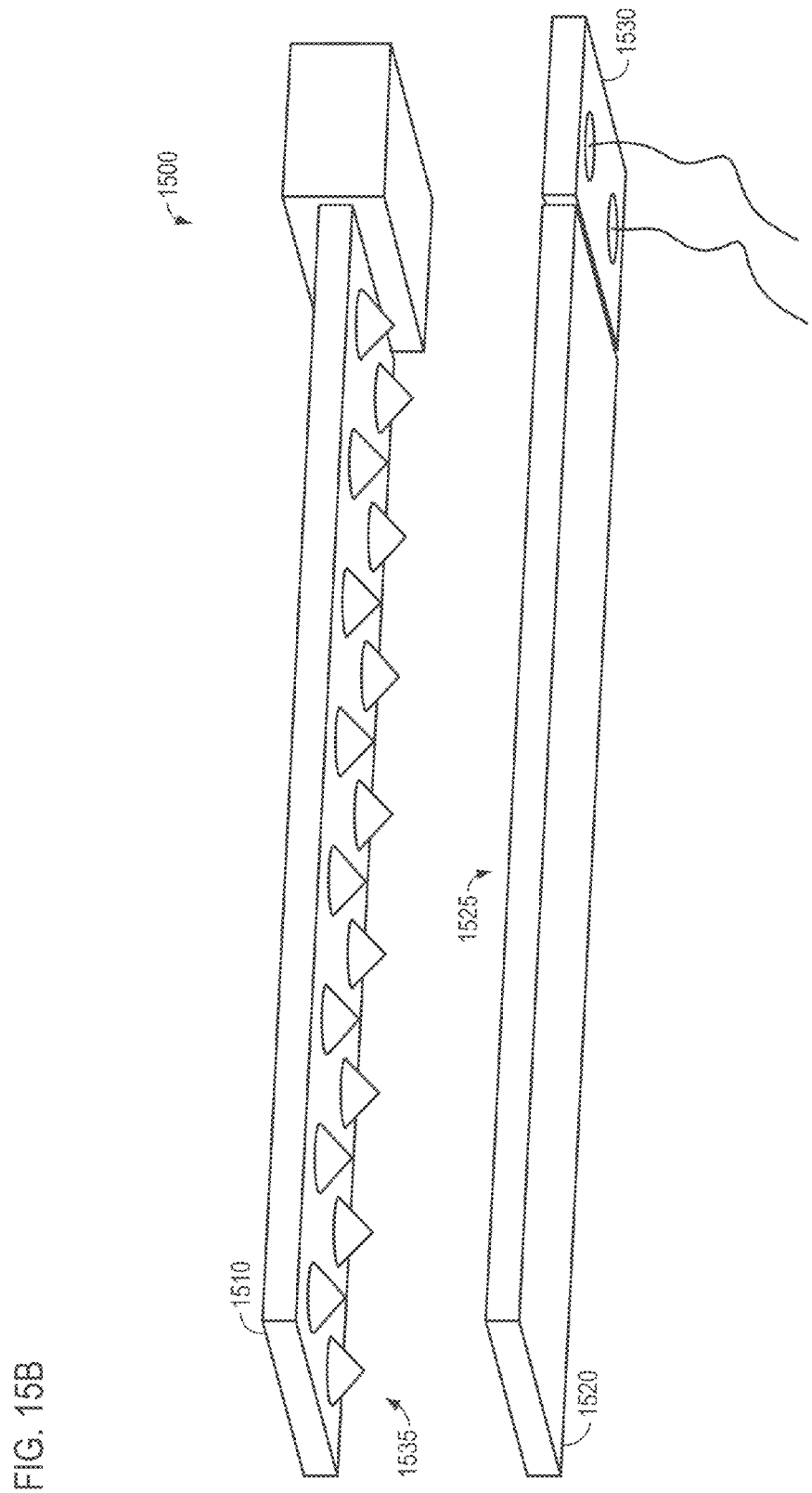
FIG. 15B illustrates a buffer surface comprising a plurality of cone-shaped protrusions configured to cooperate to selectively maintain a plurality of particles during an acoustic cycle of an acoustically driven shift register.

FIG. 15B illustrates the buffer surface 1510 comprising a plurality of cone-shaped protrusions 1535 configured to cooperate to selectively maintain a plurality of particles during at least a portion of an acoustic cycle of the acoustically driven shift register 1500.

FIG. 15C illustrates the buffer surface 1510 with two channels 1515 and 1516 configured to at least partially constrain particles on the buffer surface. In some embodiments, the channels 1515 and 1516 may serve to fine tune the location of particles as they are transferred from the first surface 1520 to the buffer surface 1510. Similar channels on the upper surface 1525 of the first surface 1520 may also serve to fine tune the location of particles as they are transferred from the buffer surface 1510 to the first surface 1520.

FIGS. 16A-16F illustrate a complete acoustic cycle of an acoustically driven shift register configured to shift physical particles, according to another embodiment. As illustrated, the acoustically driven shift register may include a first surface 1616 with an A row of wells 1621A, 1622A, and 1623A and a B row of wells 1621B, 1622B, and 1623B. Each well in a row may be evenly spaced by a spacing distance. The separation distance between wells of adjacent rows may or may not be equal to the spacing distance. The acoustically driven shift register may also include a buffer surface 1610 that is substantially parallel to the first surface 1616 and is configured to receive and retain the physical particle (shown as a black ball but not numbered for legibility) during at least a portion of an acoustic wave cycle. The physical particle is shown as associated with well 1622A.

Figure 16A:
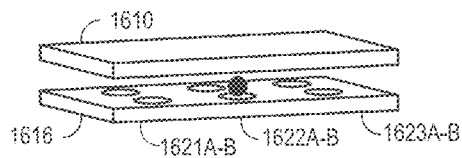
FIGS. 16A-16F illustrate a complete acoustic cycle of an acoustically driven shift register configured to shift physical particles, according to another embodiment.
Figure 16B:
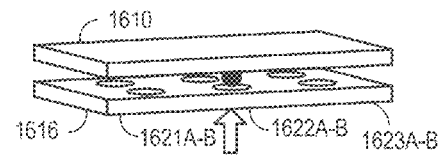
Figure 16C:
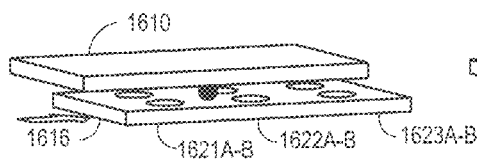
Figure 16D:
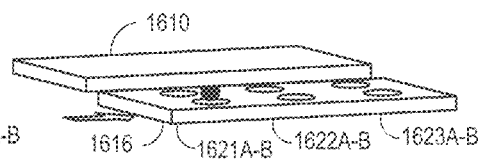

FIG. 16A illustrates the buffer surface 1610 and the first surface 1616 in a static position relative to one another. In the static position, the particle may or may not be in contact within the buffer surface 1610. FIG. 16B illustrates an acoustic wave causing the first surface 1616 to be displaced upward slightly during a circular motion caused by the acoustic wave. As illustrated, the particle may come in contact with the buffer surface 1610 during this portion of the acoustic wave. FIG. 16C illustrates the acoustic wave displacing the first surface 1616 to the right by one half of the spacing distance. As illustrated, the buffer surface 1610 may prevent the physical particle from moving in concert with the first surface 1616. FIG. 16D illustrates the acoustic wave displacing the first surface 1616 by the spacing distance, such that the particle is now associated with the well 1621A.

Figure 16E:
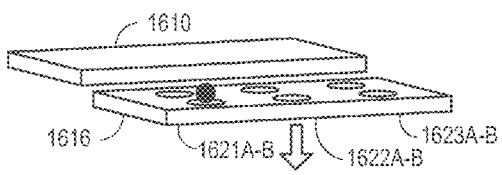
Figure 16F:
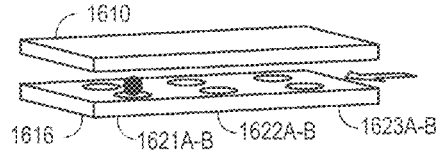

FIG. 16E illustrates a portion of the acoustic wave cycle in which the first surface 1616 is shifted downward slightly during the circular motion, such that the particle is no longer in contact with the buffer surface 1610. Accordingly, as the acoustic wave finishes its circular cycle and the first surface is returned to the static position, as illustrated in FIG. 16F, the particle remains in well 1621A. Accordingly, rather than transfer particles from the first surface to the buffer surface during cycles, as illustrated and described in some embodiments herein, a circular acoustic wave cycle may be utilized to shift particles from original wells to different wells. As the wells may be potential wells (instead of physical cavities), it will be appreciated that the acoustic wave may be configured to displace the buffer surface 1610 instead of or in addition to the first surface 1616.

Figure 17:
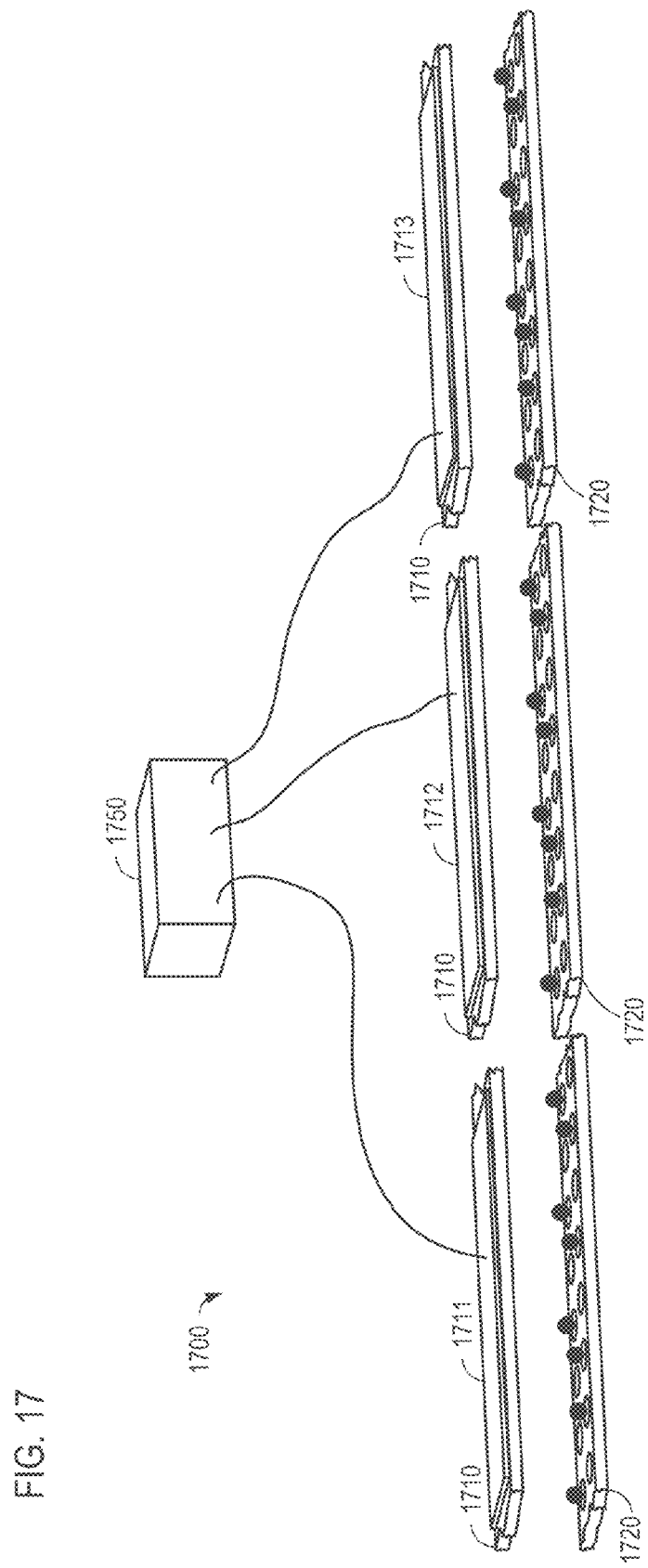
FIG. 17 illustrates a controller configured to control one or more portions of one or more acoustically driven shift registers using a plurality of field generators.

FIG. 17 illustrates an electronic controller 1750 configured to control one or more portions of one or more acoustically driven shift registers 1700 using a plurality of field generators 1711, 1712, and 1713. In the illustrated embodiment, a transducer, or other wave generator, may generate an acoustic wave to displace the first surfaces 1720 and/or the buffer surfaces 1710. As detailed herein, the particles may be transferred to the buffer surface 1710 (or secured in contact with the buffer surface as in FIG. 16) during at least a portion of the acoustic wave cycle.

In various embodiments, the controller 1750 may control the generation of the acoustic wave. As the acoustic wave is propagated through the first surfaces 1720 and/or the buffer surfaces 1710, the controller 1750 may sequentially activate each of the field generators 1711, 1712, and 1713 to transfer the particles from the first surface 1720 to the buffer surface 1710 (or simply secure the particles in place in the embodiment described in conjunction with FIG. 16). According to various embodiments, the particles may thereby be shifted from an original well to a different (e.g., adjacent or two-well jump) well.

In various embodiments, the wells or sets of wells on the first surface may transfer easier in one direction than the other. For example, a saw-tooth arrangement may facilitate the transfer of particles over a small rise in one direction but a large rise in the other direction. The acoustic wave may facilitate synchronized transfer and wave motion between various sets of wells.

FIGS. 18A-18E illustrate various embodiments of particles being transferred from a lower surface to an upper surface based on the displacement of the upper and/or lower surfaces based on the amplitudes of acoustic waves in a portion of the surface, such as a portion corresponding to a set of wells.

Figure 18A:
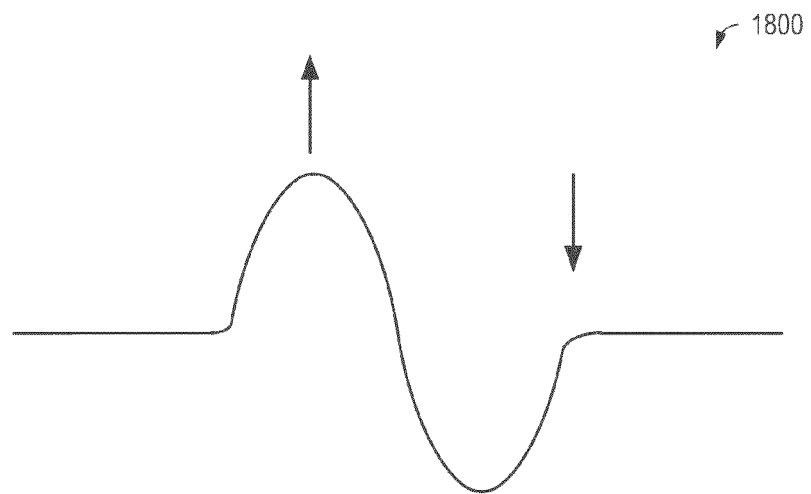
FIG. 18A illustrates a representation of an acoustic wave and the timing of particle transfers from a lower first surface to an upper buffer surface based on the timing of the relative minimum and maximum amplitudes, according to one embodiment.

FIG. 18A illustrates a representation of an acoustic wave 1800 and the timing of particle transfers from a first surface to an upper buffer surface (the up arrow) at a maximum positive displacement, and then from the upper buffer surface to the lower first surface (the down arrow) at steady or rest state at the completion of a cycle.

Figure 18B:
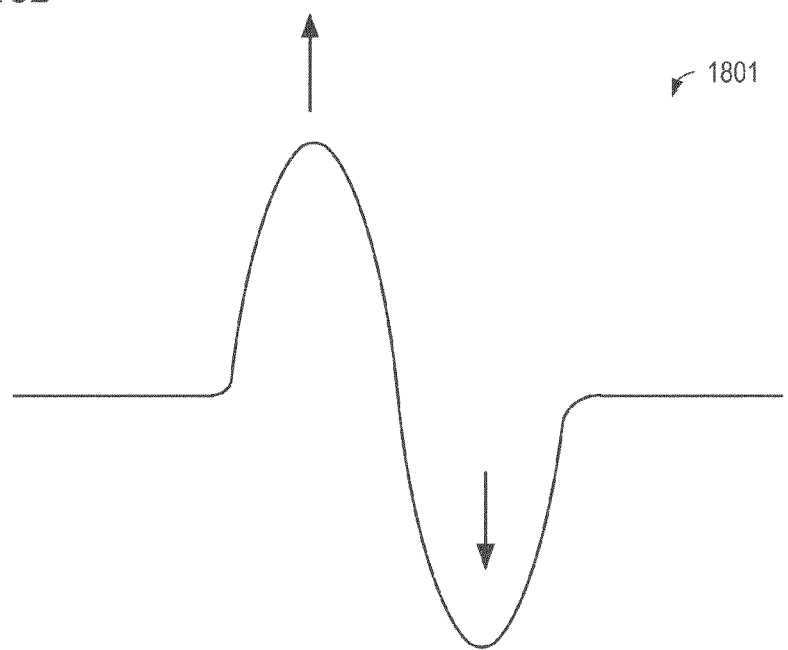
FIG. 18B illustrates another representation of an acoustic wave and the timing of particle transfers from a lower first surface to an upper buffer surface, according to one embodiment.

FIG. 18B illustrates a representation of an acoustic wave 1801 and the timing of particle transfers from a first surface to an upper buffer surface (the up arrow) at a maximum positive displacement, and then from the upper buffer surface to the first surface (the down arrow) and a maximum negative displacement.

Figure 18C:
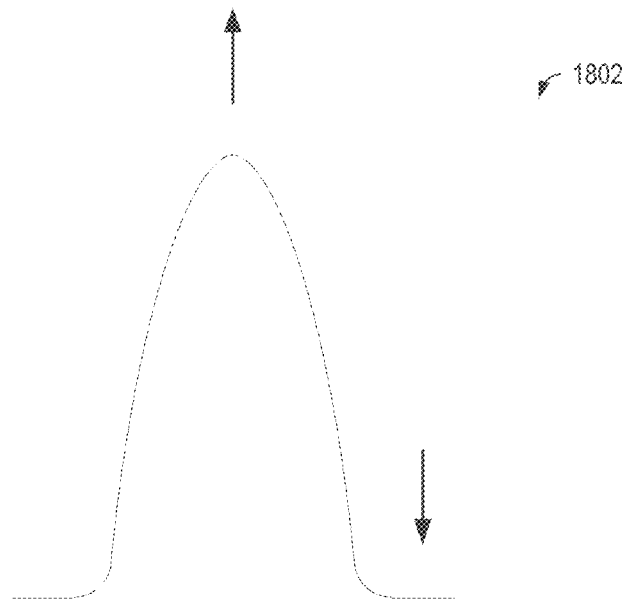
FIG. 18C illustrates another representation of an acoustic wave and the timing of particle transfers from a lower first surface to an upper buffer surface, according to one embodiment.

FIG. 18C illustrates a representation of an acoustic wave 1802 and the timing of particle transfers from a first surface to an upper buffer surface (the up arrow) at a maximum positive displacement of a haversine or pulsed wave, and then from the upper buffer surface to the first surface (the down arrow) at a steady state.

Figure 18D:
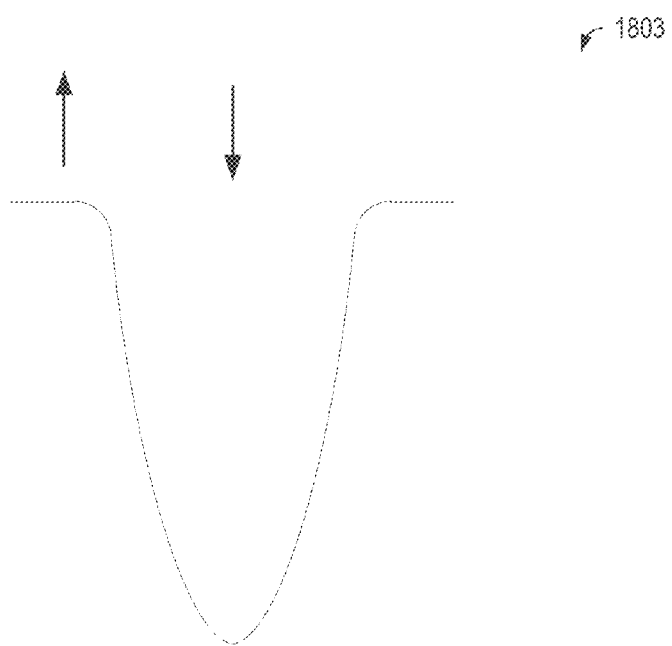
FIG. 18D illustrates another representation of an acoustic wave and the timing of particle transfers from a lower first surface to an upper buffer surface, according to one embodiment.

FIG. 18D illustrates a representation of an acoustic wave 1803 and the timing of particle transfers from a first surface to an upper buffer surface (the up arrow) at a steady state prior to a haversine or pulsed wave, and then from the upper buffer surface to the first surface (the down arrow) at a maximum negative displacement.

Figure 18E:
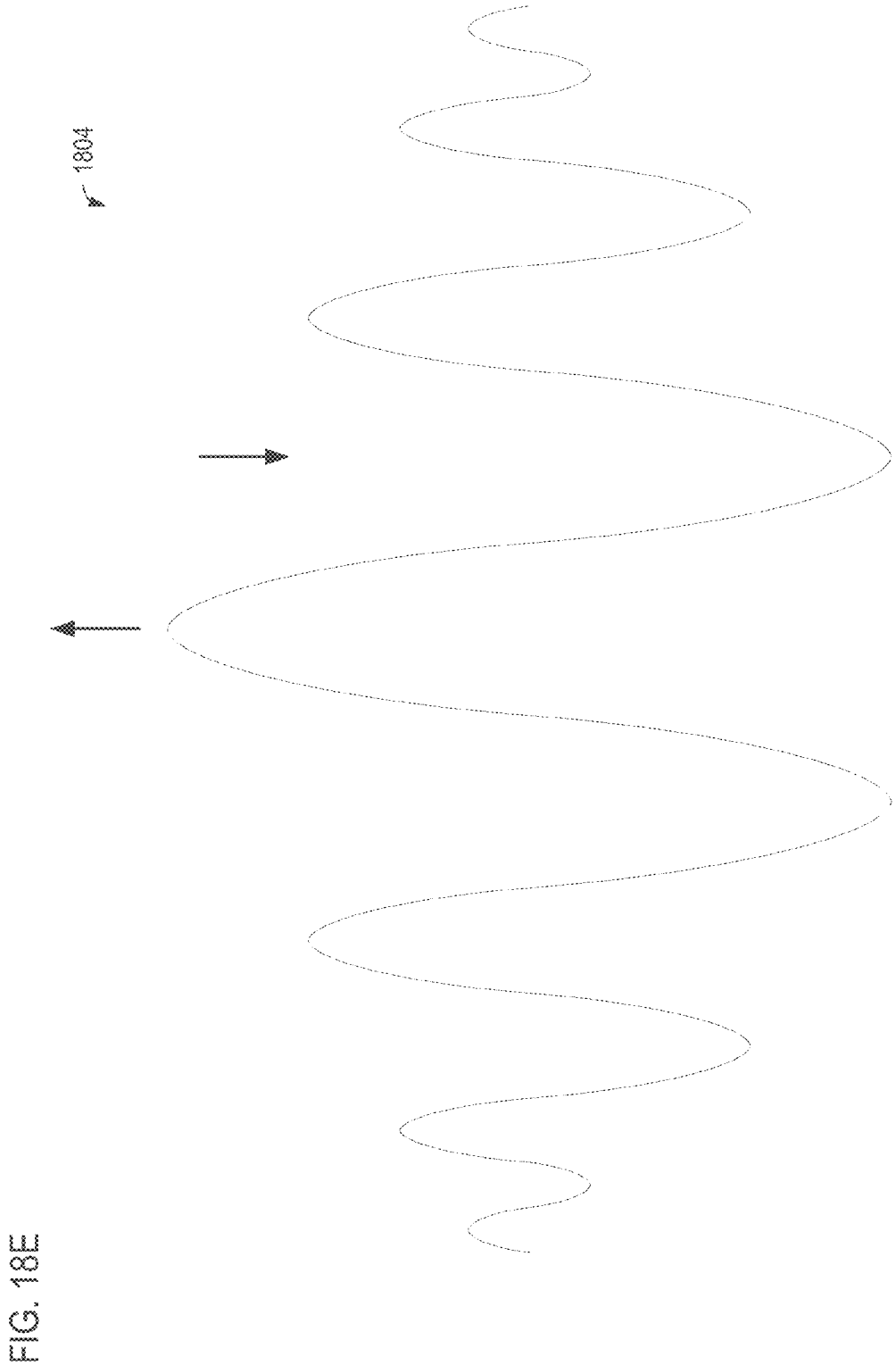
FIG. 18E illustrates another representation of an acoustic wave and the timing of particle transfers from a lower first surface to an upper buffer surface based on the amplitudes of a resonant acoustic wave, according to one embodiment.

FIG. 18E illustrates another representation of an acoustic wave 1804 and the timing of particle transfers from a lower first surface to an upper buffer surface (the up arrow) based on the amplitudes of a resonant acoustic wave, according to one embodiment.

FIG. 19A illustrates an embodiment of an acoustic wave 1930 relative to three sets of wells. As illustrated, the acoustic wave 1930 propagates lengthwise along the sets of wells with a velocity, V, along the x-axis of the illustrated coordinate system. Each set of wells is disposed on a first surface 1920, 1921, and 1922. A buffer surface 1910, 1911, and 1912 may be above each of the wells. An electrode associated with the buffer surface may receive an E-field pulse to cause the particles to transfer from the first surface 1920-1922 to the buffer surface 1910-1912 when the first surface 1920-1922 and/or the buffer surface 1910-1912 are at a maximum displacement. The maximum displacement may correspond to a maximum or minimum of the acoustic wave 1930.

A shaded arrow on buffer surface 1910 represents the displacement along the x-axis by the acoustic wave 1930 at a positive maximum. A shaded dot on buffer surface 1911 represents the null displacement along the x-axis by the acoustic wave 1930 at the zero point of the acoustic wave. A shaded arrow on buffer surface 1912 represents the displacement along the x-axis by the acoustic wave 1930 at a negative maximum.

Accordingly, in the illustrated embodiment, the representative waveform is shown at a time t1, in which the maximum is between the first and second sets of wells. Thus, the first set of wells may receive a pulse (that causes the particles to transfer) at a time t1−0.25 (i.e., a quarter of a cycle in the past). The second set of wells may receive a pulse at t1+0.25 (i.e., a quarter of a cycle in the future). Finally, the third set of wells may receive a pulse at t1+0.75 (i.e., a three-quarters of a cycle in the future).

FIG. 19B illustrates an embodiment of the relative size of the wavelength of an acoustic wave 1960 relative to a plurality of sets of wells 1950. As the waveform travels, a signal may cause the particles to be transferred between buffer and first surfaces, or vice-versa, at various maximum, zero, and minimum points on the acoustic wave 1960. As in other embodiments, the maximums, zeros, and minimums of the acoustic wave may relate to corresponding displacements of the first surface and/or the buffer surface.

In the illustrated embodiment, at a maximum positive displacement (corresponding to a maximum in the acoustic wave 1960) a pulse may cause particles in one set of wells 1971 to be transferred from a first surface to a buffer surface. At a maximum negative displacement (corresponding to a minimum in the acoustic wave 1960) a pulse may cause particles in another set of wells 1972 to be transferred from the buffer surface to the first surface. As in other embodiments, each well may represent a set of wells, or set of wells may include only a single well. Thus, each set of wells (e.g., 1971 and 1972) may include only a single well, or tens, hundreds, or thousands of wells. Sets of wells may be one-dimensional matrices (i.e., a line of wells) or two-dimensional matrices of wells (as illustrated in FIGS. 19A-B). As in other embodiments, wells may be physical wells or potential wells. Similarly, wells may be formed within channels, physically bounded in one direction on the buffer surface and another direction on the first surface, and/or may be bounded by potential forces.

Figure 20:
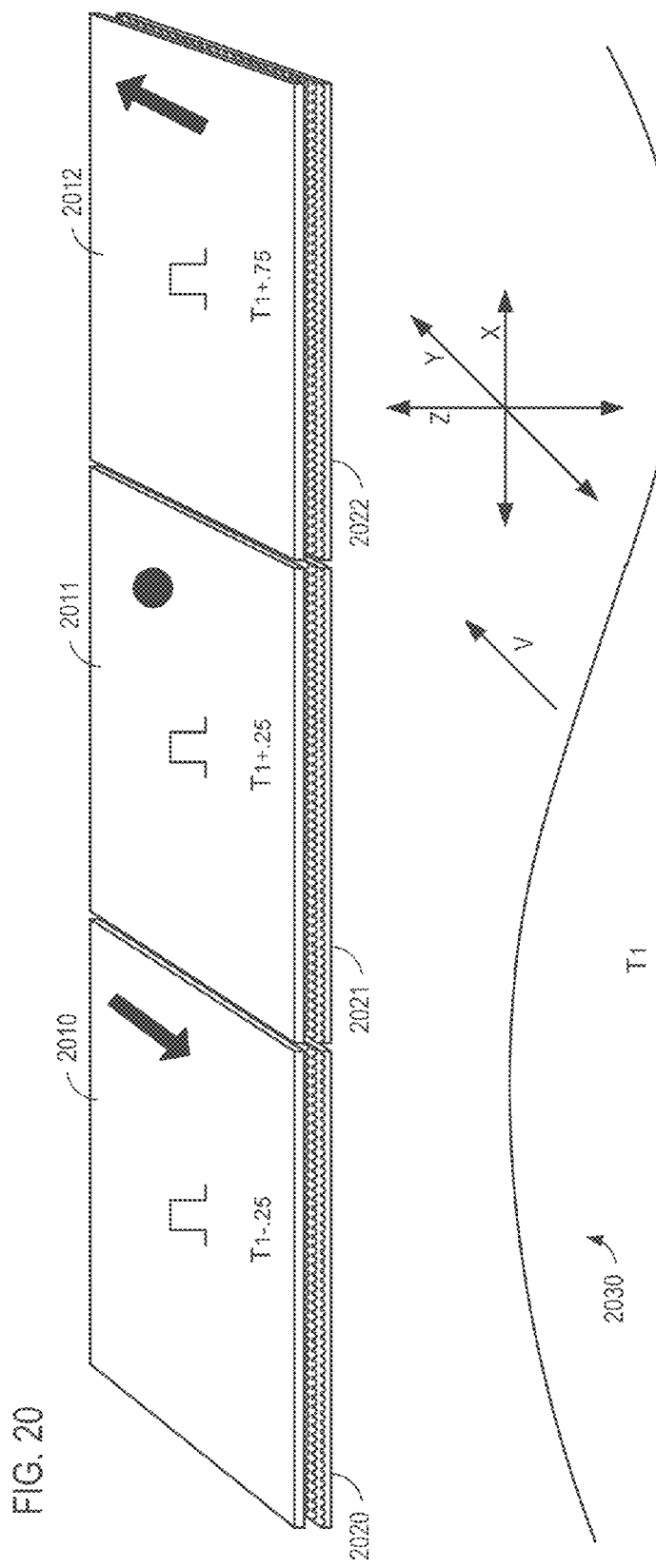
FIG. 20 illustrates an embodiment of a transverse acoustic wave relative to three sets of wells.

FIG. 20 illustrates an embodiment of a transverse acoustic wave 2030 relative to three sets of wells. Each set of wells is disposed on a first surface 2020, 2021, and 2022. A buffer surface 2010, 2011, and 2012 may be above each of the wells. An electrode associated with the buffer surface may receive an E-field pulse to cause the particles to transfer from the first surface 2020-2022 to the buffer surface 2010-2012 when the first surface 2020-2022 and/or the buffer surface 2010-2012 are at a maximum displacement. The maximum displacement may correspond to a maximum or minimum of the acoustic wave 2030.

A shaded arrow on buffer surface 2010 represents the transverse displacement along the y-axis by the transverse acoustic wave 2030 at a positive maximum. A shaded dot on buffer surface 2011 represents the null transverse displacement along the y-axis by the acoustic wave 2030 at a zero point of the acoustic wave. A shaded arrow on buffer surface 2012 represents the transverse displacement along the y-axis by the acoustic wave 2030 at a negative maximum.

Accordingly, in the illustrated embodiment, the representative waveform is shown at a time t1, in which the maximum is between the first and second sets of wells. Thus, the first set of wells may receive a pulse (that causes the particles to transfer) at a time t1−0.25 (i.e., a quarter of a cycle in the past). The second set of wells may receive a pulse at t1+0.25 (i.e., a quarter of a cycle in the future). Finally, the third set of wells may receive a pulse at t1+0.75 (i.e., a three-quarters of a cycle in the future).

While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

Moreover, one of ordinary skill in the art will appreciate that various modifications and changes can be made without departing from the scope of the present disclosure and that other uses for the described systems and methods are possible. Accordingly, this disclosure is to be regarded in an illustrative rather than a restrictive sense, and all such modifications and uses are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. The scope of the present invention should, therefore, be determined by the following claims.

What is claimed is:

1. A method, comprising:
   disposing a plurality of particles selectively within a set of wells on a first surface, wherein the set of wells is one of a plurality of sets of wells, and wherein each set of wells is spaced at intervals along a longitudinal axis of the first surface by a spacing distance from an adjacent set of wells;
   generating, via a transducer, an acoustic wave with an amplitude corresponding to the spacing distance, such that the first surface and the set of wells is displaced from a static position by at least one half the spacing distance along the longitudinal axis at a peak amplitude of the acoustic wave;
   transferring the particles of the set of wells from the first surface to a buffer surface when the first surface is displaced by a first displacement distance by the acoustic wave relative to the static position; and
   returning the transferred particles from the buffer surface to the first surface when the first surface is displaced a second displacement distance by the acoustic wave relative to the static position,
   wherein the first displacement distance is different from the second displacement distance, such that each of the plurality of particles is shifted from an original well to a different well.

2. The method of claim 1, wherein at least one set of wells of the plurality of sets of wells consists of a single well.

3. The method of claim 1, wherein each set of wells comprises at least two wells.

4. The method of claim 3, wherein a spacing distance between each of the wells within a set of wells is equal to the spacing distance between wells of each other set of wells.

5. The method of claim 1, wherein at least some of the plurality of sets of wells comprise potential wells on or in the first surface, wherein each potential well is configured to selectively retain one or more of the plurality of particles via an attractive force.

6. The method of claim 1, wherein the first displacement distance comprises one half the spacing distance in a first direction along the longitudinal axis, and wherein the second displacement distance comprises one half the spacing distance in a second, opposite direction along the longitudinal axis, such that each of the plurality of particles is shifted from an original well in the set of wells to a corresponding well in an adjacent set of wells.

7. The method of claim 1, wherein the first displacement distance comprises the spacing distance, and wherein the second displacement distance comprises zero displacement relative to the static position, such that each of the plurality of particles is shifted from an original well in a the set of wells to a corresponding well in an adjacent set of wells.

8. The method of claim 1, wherein the first displacement distance comprises a first multiple of the spacing distance and the second displacement distance comprises a second multiple of the spacing distance, and wherein the sum of the absolute values of the first displacement distance and the second displacement distance is approximately an integer multiple of the spacing distance.

9. The method of claim 8, wherein the first displacement distance is equal to two-thirds of the spacing distance in a first direction, and the second displacement distance is equal to one-third of the spacing distance in a second, opposite direction, such that each of the plurality of particles is shifted from an original well in the set of wells to a corresponding well in an adjacent set of wells.

10. The method of claim 8, wherein the first displacement distance is equal to 1.25 times the spacing distance in a first direction, and the second displacement distance is equal to .75 times the spacing distance in a second, opposite direction, such that each of the plurality of particles is shifted from an original well in the set to a wells to a corresponding well in a set of wells that is two spacing distances away from the set of wells.

11. The method of claim 1, wherein each well having a first number of particles or less represents a first state of two states and each well having a second number of particles or more represents a second state of the two states.

12. The method of claim 11, wherein the first number is zero, such that each well having zero particles represents the first of the two states.

13. The method of claim 11, wherein the second number is one, such that each well having one or more particles represents the second of the two states.

14. The method of claim 11, wherein the second number is one, such that each well having one particle represents the second of the two states, and the method further comprising:
determining an error has occurred when a well having more than one particle is detected.

15. The method of claim 1, wherein each well having a first number of particles or less represents a first state of N states, each well having a second number of particles represents a second state of the N states, and each well having a third number of particles represents a third state of the N States, wherein N is an integer greater than two.

16. The method of claim 1, wherein each well having a particle in a first portion of the well represents a first state and each well having a particle in a second portion of the well represents a second state.

17. The method of claim 16, wherein the first state is a 1 in a binary data representation system and the second state is a 0 in the binary data representation system.

18. The method of claim 1, further comprising:
determining the number of particles in one of the sets of wells after a predetermined number of shifts of the plurality of particles.

19. The method of claim 1, wherein each of the plurality of particles is charged such that each of the plurality of particles is attracted to the buffer surface, and
wherein transferring each of the plurality of particles from the first surface to the buffer surface comprises decreasing an electric field to allow each of the plurality of particles to move toward the buffer surface.

20. A method, comprising:
disposing a plurality of particles within a set of wells on a first surface, wherein the set of wells is one of a plurality of sets of wells, and wherein each set of wells is spaced at intervals along a longitudinal axis of a first surface by a spacing distance from an adjacent set of wells;
transferring each of the plurality of particles within the set of wells from the first surface to a buffer surface while the first surface and the corresponding set of wells is in a static position;
generating, via a transducer, an acoustic wave with an amplitude corresponding to the spacing distance, such that the first surface and associated set of wells are displaced by at least the spacing distance along the longitudinal axis at a peak amplitude of the acoustic wave; and
returning each of the plurality of particles from the buffer surface to the first surface when the first surface is displaced by an integer multiple of the spacing distance by the acoustic wave,
wherein the integer multiple is greater than zero, such that each of the plurality of particles is shifted from an original well to a different well.

21. The method of claim 20, wherein the set of wells are spaced transversely with respect to the longitudinal axis and along the longitudinal axis in at least a 2×2 matrix of wells.

22. The method of claim 21,
wherein the number and arrangement of wells on the buffer surface corresponds to the number of wells on the first surface.

23. The method of claim 20, wherein at least one of the particle is a Buckminsterfullerene molecule (buckyball).

24. A memory array, comprising:
a plurality of particles;
a plurality sets of wells uniformly spaced by a spacing distance along a longitudinal axis of a first surface, wherein each of the plurality of sets of wells is configured to selectively retain at least one set of the plurality of particles;
a buffer surface positioned substantially parallel to the first surface, the buffer surface configured to selectively retain the plurality of particles;
a field control unit configured to selectively modify a field characteristic of the memory array to transfer at least some of the plurality of particles between the first surface and the buffer surface; and
an acoustic wave controller to control the generation of an acoustic wave by an acoustic transducer to displace the first surface and associated wells along the longitudinal axis by at least one half of the spacing distance relative to the buffer surface at a peak amplitude of the acoustic wave.

25. The memory array of claim 24, wherein the controller is configured to cause the acoustic wave transducer to selectively displace the first surface by the spacing distance at the peak amplitude of the acoustic wave.

26. The memory array of claim 25, wherein the first number is zero, such that each well having zero particles is configured to represent the first of the two states.

27. The memory array of claim 25, wherein the second number is one, such that each well having one or more particles is configured to represent the second of the two states.

28. The memory array of claim 24, wherein the controller is configured to cause the acoustic wave transducer to selectively displace the first surface by one half the spacing distance at the peak amplitude of the acoustic wave.

29. The memory array of claim 24, wherein the controller is configured to cause the acoustic wave transducer to selectively displace the first surface by double the spacing distance at the peak amplitude of the acoustic wave.

30. The memory array of claim 24, wherein each well having a first number of particles or less is configured to represent a first state of two states and each well having a second number of particles or more is configured to represent a second state of the two states.

31. The memory array of claim 24, wherein each set of wells comprises M particles within N wells, and wherein each permutation of the M particles within the N wells represents one of a plurality of data states.

32. The memory array of claim 24, wherein a set of wells comprises a plurality of wells extending transverse to the longitudinal axis and along the longitudinal axis, so as to form a two-dimensional matrix.

33. The memory array of claim 32, wherein a spacing distance between each of the wells is the same as the spacing distance between each of the plurality of sets of wells.

34. The memory array of claim 32, wherein a spacing distance between each of the wells is different than the spacing distance between each of the plurality of sets of wells.

35. The memory array of claim 32, wherein a spacing distance between each of the wells is non-uniform.

36. The memory array of claim 32, wherein a spacing distance between each of the wells is uniform.

37. The memory array of claim 32, wherein each of the plurality of sets of wells is disposed in or on a physical cavity in the first surface configured to selectively retain one or more of the plurality of particles.

38. The memory array of claim 37, wherein each well comprises a physical cavity configured to selectively retain one or more of the plurality of particles.

39. The memory array of claim 32, wherein each of the plurality of sets of wells comprises a potential well in the first surface configured to selectively retain one or more of the plurality of particles via an attractive force.

40. The memory array of claim 32, wherein the buffer surface comprises a plurality of wells uniformly spaced transverse to the longitudinal axis of the first surface, and
wherein the number of wells on the buffer surface corresponds to the number of wells on the first surface.

41. The memory array of claim 40, wherein each of the plurality of sets of wells on the buffer surface extend in the direction of the longitudinal axis of the first surface, such that the plurality of wells on the buffer surface extend transverse to each of the plurality of wells on the first surface.

* * * * *